United States Patent
Kawamura

[19]

[11] Patent Number: 6,052,323
[45] Date of Patent: Apr. 18, 2000

[54] MEMORY CIRCUIT INCLUDING REDUCED AREA SENSE AMPLIFIER CIRCUITRY

[75] Inventor: J. Patrick Kawamura, Richardson, Tex.

[73] Assignee: Texas Instruments Incorporated, Dallas, Tex.

[21] Appl. No.: 09/354,839

[22] Filed: Jul. 16, 1999

Related U.S. Application Data

[60] Provisional application No. 60/093,759, Jul. 22, 1998.

[51] Int. Cl.[7] ........................................................ G11C 7/00
[52] U.S. Cl. ............................ 365/205; 365/207; 365/51; 365/63
[58] Field of Search ..................................... 365/207, 205, 365/149, 51, 63, 203

[56] References Cited

U.S. PATENT DOCUMENTS

| | | | |
|---|---|---|---|
| 5,793,689 | 8/1998 | Yoon et al. ................................ | 365/205 |
| 5,828,613 | 10/1998 | Hatakeyama et al. ................... | 365/205 |
| 5,848,017 | 12/1998 | Bissaey .................................. | 365/205 X |
| 5,859,805 | 1/1999 | Takashima et al. .................. | 365/63 X |

*Primary Examiner*—Huan Hoang
*Attorney, Agent, or Firm*—Robby T. Holland; Carlton H. Hoel; Frederick J. Telecky, Jr.

[57] ABSTRACT

A memory circuit (10) provides reduced array sense amplifier circuitry (20, 22) for a memory cell array (24, 26, 28, 30), which has a plurality of memory cells (340) for electrically storing data. A plurality of bitlines (260) are associated with a memory cell array (26) for carrying data to and from the memory cells therein. At least one sense amplifier circuit (16) includes circuitry (332, 334) for addressing selected memory cells via column select lines, and for communicating with an external source of address signals. A local sense amplifier circuit (20, 22) includes circuitry (262, 266) for communicating with the sense amplifier circuit through the selected bitlines. The local sense amplifier circuit also includes circuitry (234, 238) for communicating with other bitlines (232, 236) for addressing other memory cells (28), and further for transmitting data to and from the other memory cells along the selected bitlines, in cooperation with the sense amplifier (16).

16 Claims, 12 Drawing Sheets

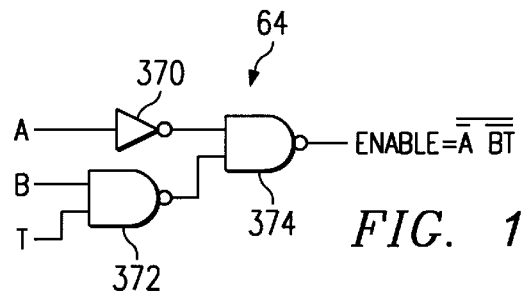
FIG. 10A
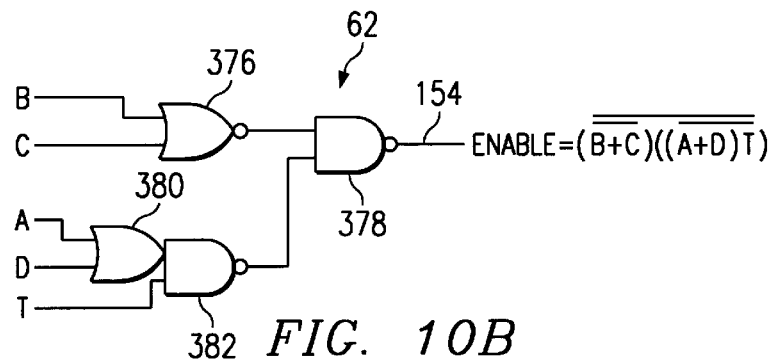
FIG. 10B
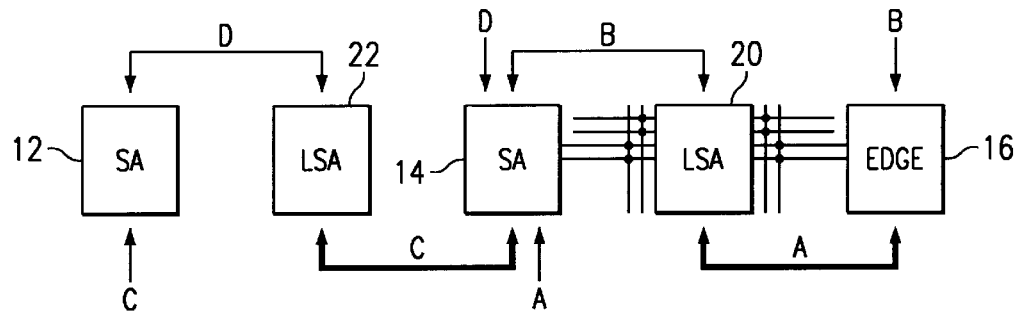
FIG. 10C
| INPUT | | | OUTPUT | | | |
|---|---|---|---|---|---|---|
| ENABLE T | RF9_1 | RF9_0 | SHRB1 | SHRB2 | SHRB3 | SHRB4 |
| 0 | 0 | 0 | 0 | 0 | 0 | 0 (ON) |
| 0 | 0 | (1) | 1 | (0)(ON) | 1 | 1 |
| 0 | 1 | 410 0 | 1 | 1 | 0 | 1 |
| 0 | 1 | 1 | X | X | X | X |
| 1 | 0 | 0 | 0 | 0 | 0 | 0 |
| 1 | 0 | (1) | 1 | (0) | 1 | (0) |
| 1 | 1 | 0 | 0 | 412 1 | 0 | 414 1 |
| 1 | 1 | 1 | X | X | X | X |
FIG. 11

MEMORY CIRCUIT INCLUDING REDUCED AREA SENSE AMPLIFIER CIRCUITRY

This application claims priority under 35 USC §119(e)(1) of provisional application number 60/093,759 filed Jul. 22, 1998.

TECHNICAL FIELD OF THE INVENTION

The present invention relates to sense amplifier circuitry for a memory and, more particularly, to sense amplifier circuitry that uses reduced area and power.

BACKGROUND OF THE INVENTION

Electronic device manufacturers are constantly pursuing ways to reduce the size and increase the operational capabilities of the electronic memory circuits used in modern computing equipment. In memory circuits that include arrays of memory cells, such as dynamic random access memories (DRAMs), for example, the array size is determined in large part by the memory cell and sense amplifier size. Although cell area is decreasing through the use of finer three-dimensional geometries and high dielectric constant storage node materials, the sense amplifier is not getting as small as desired. This is due to the amount of functionality that must be packed into the sense amplifier circuit (amplification, equalization, column select, pre-charge, and share gate devices, along with sense circuitry and supplies), and to the substrate isolation and array to direct periphery (sense amplifier circuit) spacing design rules which make it difficult to shrink the overall circuit.

Several schemes are currently used, or have been proposed, to reduce the sense amplifier portion of the memory array area. One scheme is to increase the number of bits hanging on a bitline to simply reduce the number of sense amplifiers in the array. This has been an effective solution, but since it increases the bitline-to-cell capacitance ratio, the approach adversely affects sensing speed, sensing noise margin, and power. This is due, in large part, to the slower speed and greater current flow that the higher bitline capacitance produces.

Another interesting scheme involves segmenting the bitline with pass gate transistors to increase the bitline length while holding down the bitline capacitance (commonly known as hierarchical bitlines). The purpose of this scheme is to reduce the number of sense amplifiers in the memory array. This method, nonetheless, has several drawbacks. One limitation is the difficulty of fabricating the pass gate structure. Another limitation is the marginal benefit in bitline capacitance reduction. In particular, segmenting the bitline in two parts actually does not result in a fifty percent (50%) reduction in effective bitline capacitance. This is especially true when tighter design rules are employed. In addition, significant sensing and writing speed degradation results from the increase in the number of pass gate transistors in the storage cell to sense amplifier path.

Other schemes to reduce the sense amplifier portion of the memory array area involve brute-force methods such as shrinking the sense amplifier design rules, reducing the bitline capacitance by using lower dielectric materials and shrinking the bitline using low sheet resistance materials (such as $TiSi_x$, Cu, etc.). These solutions are currently employed in the field or have been proposed to reduce the area the sense amplifiers. However, as the density of memory devices increase, there is still the need for a more robust solution.

SUMMARY OF THE INVENTION

With reference to the above limitations, there is a need for a memory circuit that includes a reduced area sense amplifier circuit for reducing the overall area of the memory circuit itself, and which does not also present the limitations of adversely affecting the sensing speed and power nor reducing the signal sensing margin that relate to known approaches for reducing memory circuit design.

According to the present invention, a method and apparatus are provided to address this need, and involve operating a memory which includes first and second sense amplifier circuits coupled to each other by a first bitline, a second bitline coupled to the second sense amplifier circuit, and first and second memory cells respectively coupled to the first and second bitlines, in particular by causing the first sense amplifier circuit to communicate with the first memory cell through the first bitline, and by causing the first and second sense amplifier circuits to cooperatively facilitate communication between the first sense amplifier circuit and the second memory cell through the first bitline, the second sense amplifier circuit, and the second bitline.

BRIEF DESCRIPTION OF THE DRAWINGS

For a more complete understanding of the present invention, and the advantages thereof, reference is now made to the following description, which is to be taken in conjunction with the accompanying drawings, in which:

FIG. 10A is a diagram showing in more detail a portion of the circuit of FIG. 1;

FIG. 10B is a diagram showing in more detail a portion of the circuit of FIG. 1;

FIG. 10C is a diagram showing how the circuitry of FIGS. 10A and 10B, coupled with signals depicted by FIG. 9, operates to activate sense amplifier cells and local sense amplifier cells;

FIG. 11 is a table showing logic minimization applicable to local sense amplifier activation for a read operation according to the present invention;

DETAILED DESCRIPTION OF THE INVENTION

Figure 1A:
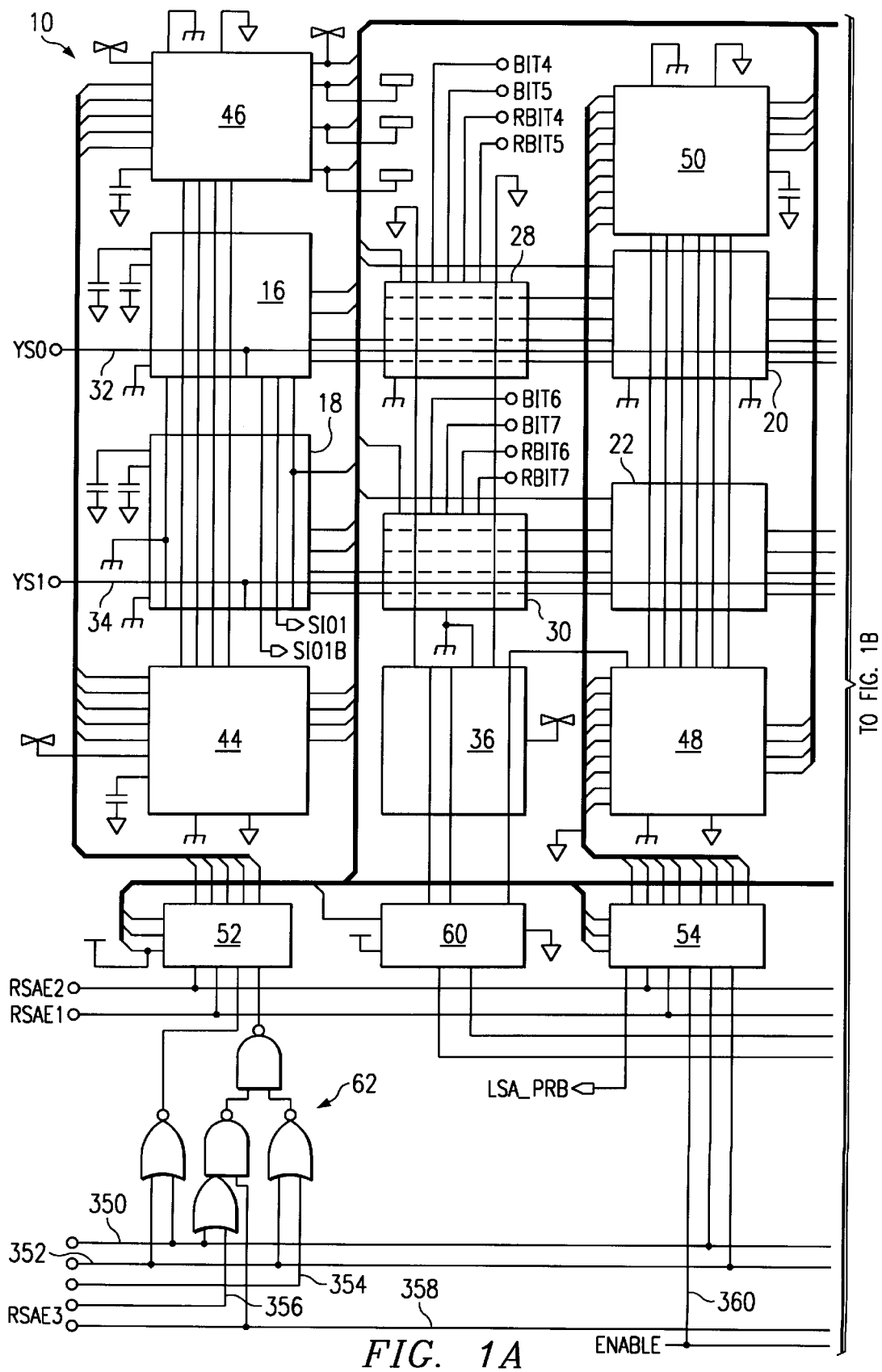
FIGS. 1A & 1B are a block diagram of a memory array circuit which embodies the present invention.
Figure 1B:
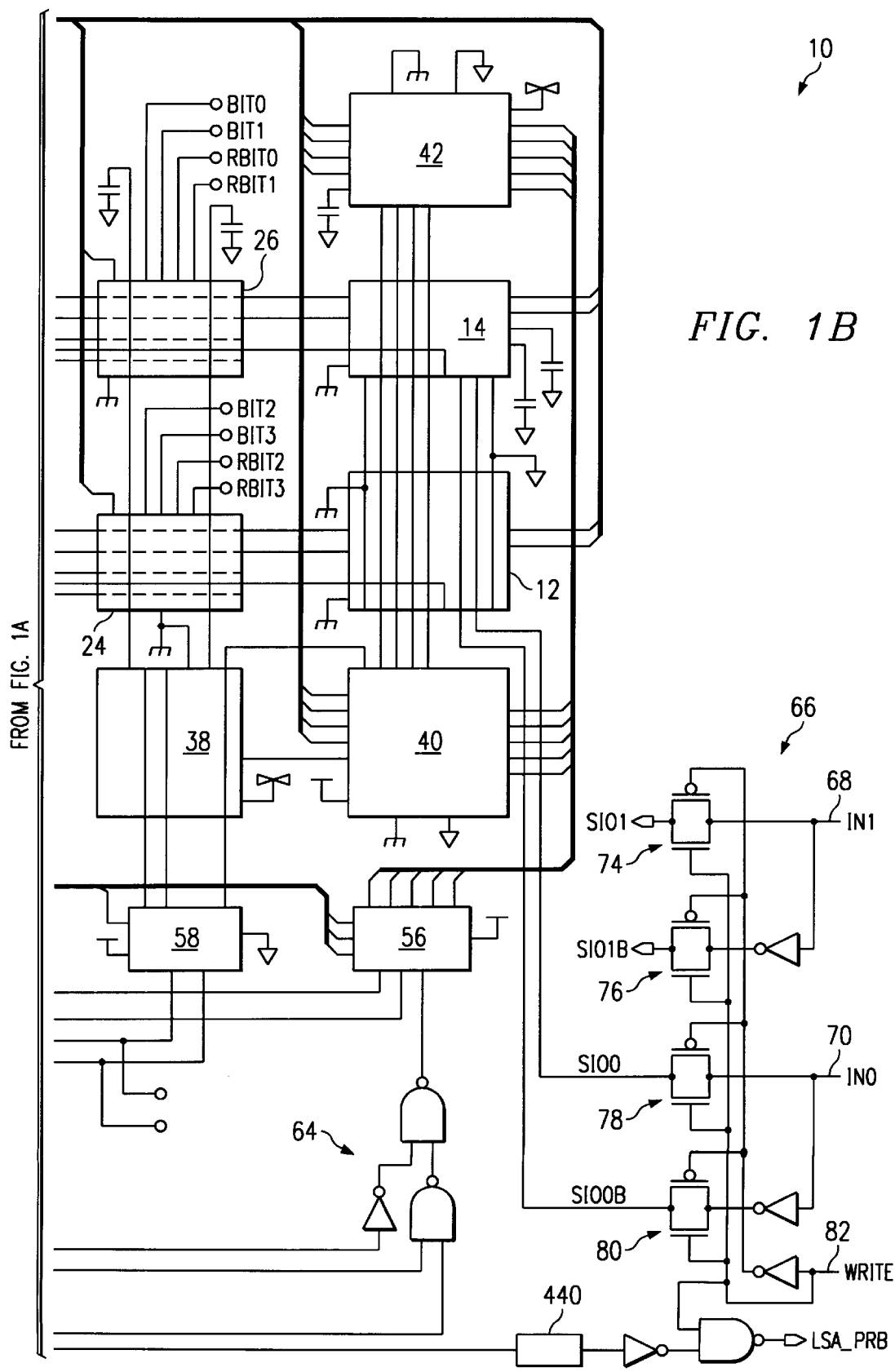

FIG. 1 illustrates a memory array 10 formed according to the teachings of the present invention, and includes a schematic depiction of the memory cells, the bitlines, and the word lines for memory array 10. Memory array 10 includes sense amplifiers 12, 14, 16 and 18. Local sense amplifier 20 is positioned between sense amplifiers 14 and 16. Local sense amplifier 22 is positioned between sense amplifiers 12 and 18. Memory cell array 24 is positioned between sense amplifier 12 and local sense amplifier 22, memory cell array 26 between sense amplifier 14 and local sense amplifier 20, memory cell array 28 between sense amplifier 16 and local sense amplifier 20, and memory cell array 30 between sense amplifier 18 and local sense amplifier 22. Y-select #0 line 32 connects to sense amplifier 16 and passes over memory cell array 28, local sense amplifier 20, and memory cell array 26 to also connect to sense amplifier 14. Y-select #1 line 34 connects to sense amplifier 18 and passes over memory cell array 30, local sense amplifier 22, and memory cell array 24 to also connect with sense amplifier 12.

Sub-wordline decoder circuit 36 connects to memory cell array 30 and memory cell array 28. Sub-word line decoder circuit 38 connects to memory cell array 24 and memory cell array 26. Intersection area circuits 40 and 42 each connect to sense amplifiers 12 and 14. Intersection area circuits 44 and 46 each connect to sense amplifiers 16 and 18. Intersection area circuits 48 and 50 each connect to local sense amplifiers 20 and 22.

Array control circuit 52 feeds signals to intersection circuits 44 and 46. Array control circuit 54 feeds signals to intersection circuits 48 and 50. Array control circuit 56 feeds signals to intersection circuits 40 and 42. Main word decoder 58 communicates with sub-word decoder 38, and main word decoder 60 communicates with sub-word decoder 36. Logic circuit 62 provides a local address decoder function for the sense architecture of the present invention. Logic circuit 64 also provides local address decoder input for the sense architecture. Read/Write circuitry 66 includes input lines 68 and 70, which come from the periphery data path circuits and two pass gates 78, 80 to perform a write operation. Write control line 82 controls the writing of data from lines 68 and 70 to the array I/O lines.

Fabrication of the memory array circuit 10, including all of the above-recited circuits, may be done by numerous well-established integrated circuit manufacturing techniques, using established semiconductor device fabrication processes.

Figure 8:
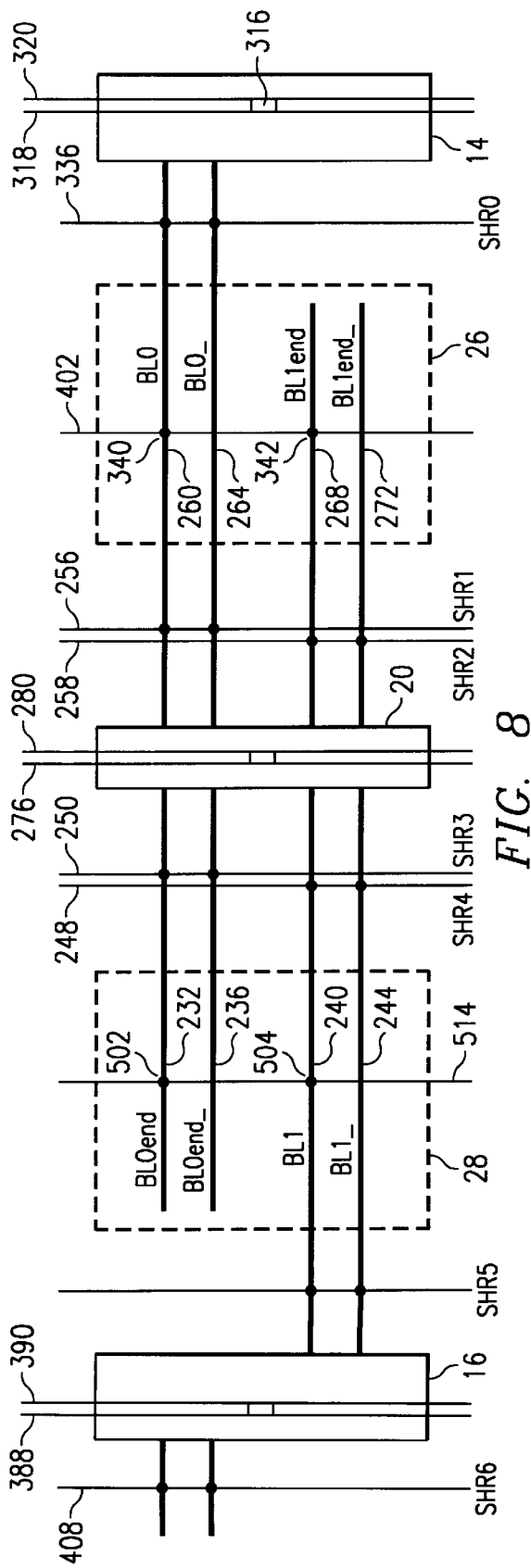
FIG. 8 is a diagrammatic view of part of the circuit of FIG. 1, showing the relationship between several circuit portions.

An overview of the present invention will now be given with reference to FIG. 8. FIG. 8 is a block diagram which shows a portion of the structure of FIG. 1. In particular, FIG. 8 shows the sense amplifiers 14 and 16, the local sense amplifier 20 therebetween, the memory cell array 26 between sense amplifier 14 and local sense amplifier 20, and the memory cell array 28 between sense amplifier 16 and local sense amplifier 20. FIG. 8 also shows two memory cells 340 and 342 in the memory cell array 26, as well as two further memory cells 502 and 504 in the memory cell array 28.

Figure 7:
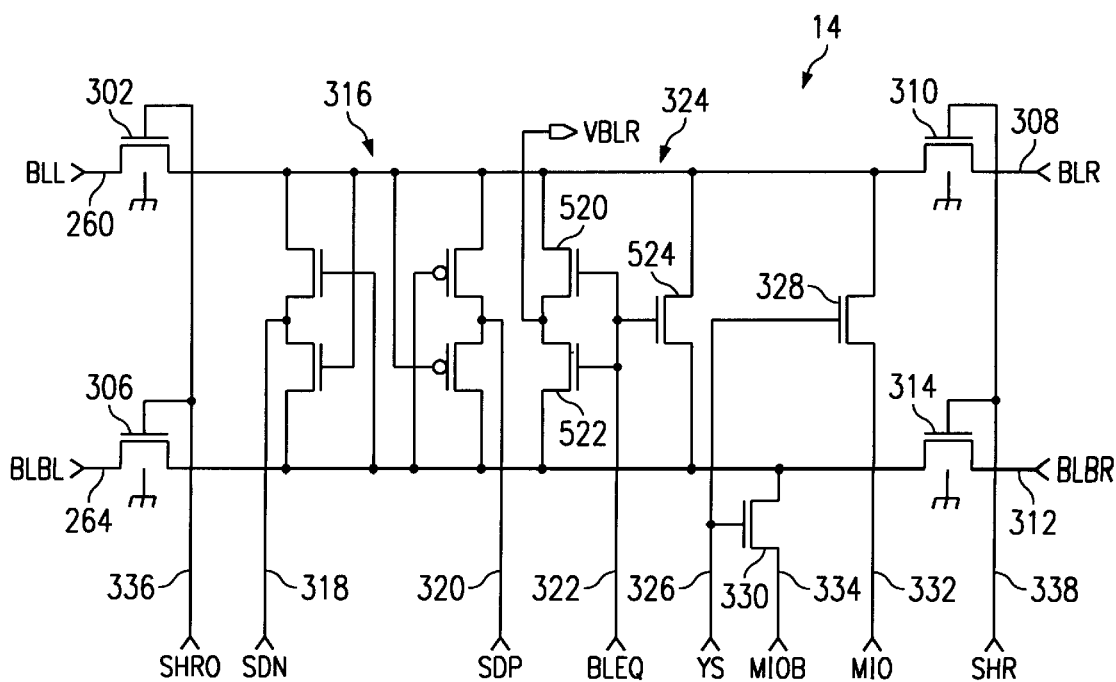
FIG. 7 is a schematic diagram of a sense amplifier cell which is part of the circuit of FIG. 1.

The memory cell 340 is associated with two bitlines 260 and 264, the memory cell 342 is associated with two bitlines 268 and 272, the memory cell 502 is associated with two bitlines 232 and 236, and the memory cell 504 is associated with two bitlines 240 and 244. In a conventional memory arrangement, a standard sense amplifier would be provided in place of the local sense amplifier 20, and would be coupled to the bitline pair 232 and 236 and the bitline pair 268 and 272, but would not be coupled to either the bitline pair 260 and 264 or the bitline pair 240 and 244. In such a configuration, the sense amplifier 14 would service the memory cell 340, the sense amplifier 16 would service the memory cell 504, and the standard sense amplifier between them would service the memory cells 342 and 502. However, FIG. 7 shows an arrangement according to the invention, which is somewhat different, and which operates differently.

More specifically, the local sense amplifier 20 has only a portion of the circuitry which is present in a standard sense amplifier, as described in more detail later. To the extent that certain circuitry is omitted from local sense amplifier 20, the local sense amplifier 20 relies for equivalent circuitry on either the standard sense amplifier 14 or the standard sense amplifier 16, as also explained in more detail later. Stated differently, the standard sense amplifier 14 directly services memory cell 340, and also services memory cell 502 through local sense amplifier 20. Similarly, standard sense amplifier 16 directly services memory cell 504, and also services memory cell 342 through local sense amplifier 20. In order to facilitate a better understanding of the present invention, an overview will now be given about how the standard sense amplifier 14 can directly read and write the memory cell 340, and how the standard sense amplifier 14 can read and write the memory cell 502 through the local sense amplifier 20.

Figure 13A:
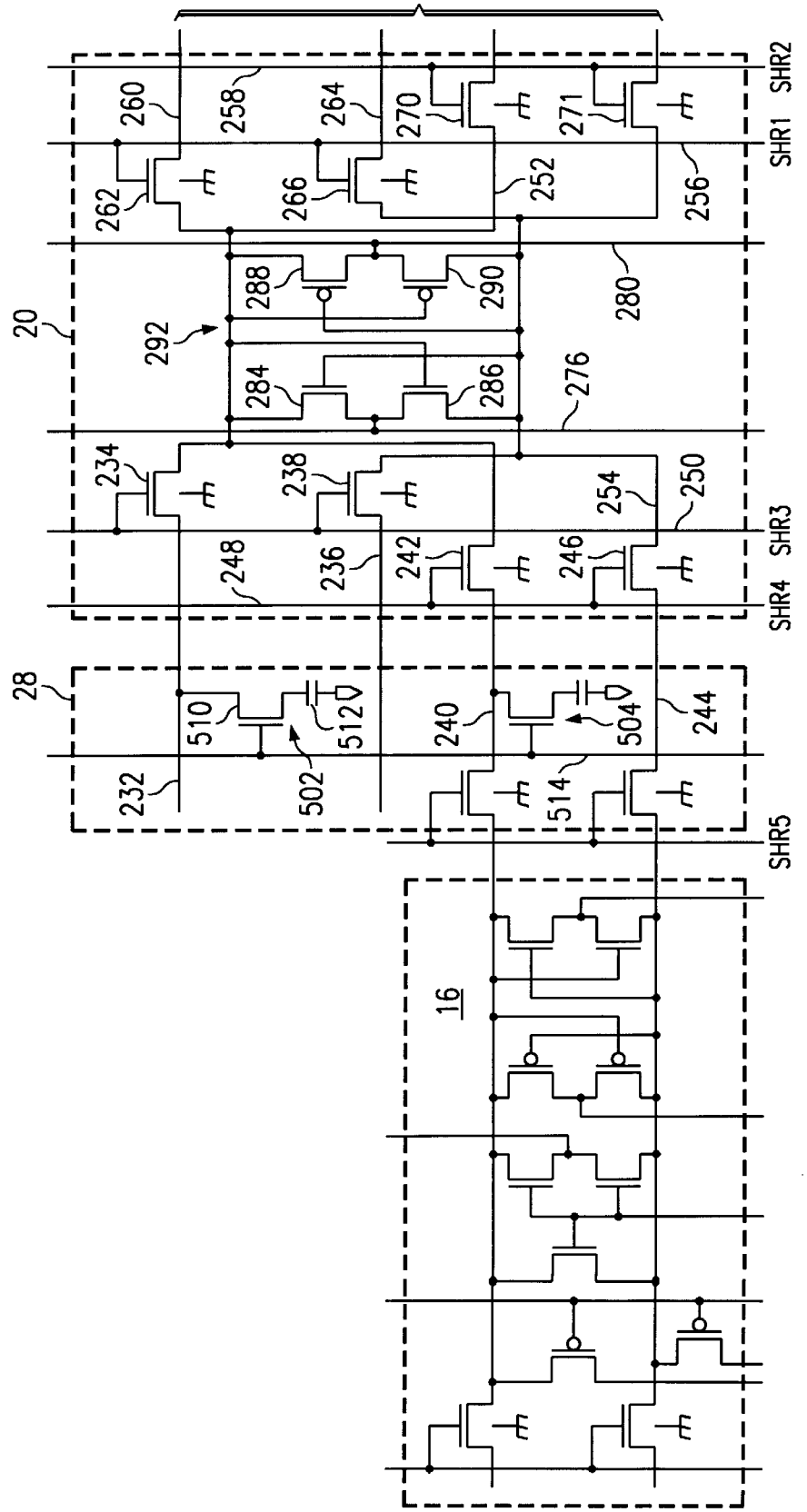
FIGS. 13A & 13B are a schematic diagram of circuitry in several components of the circuit of FIG. 1.
Figure 13B:
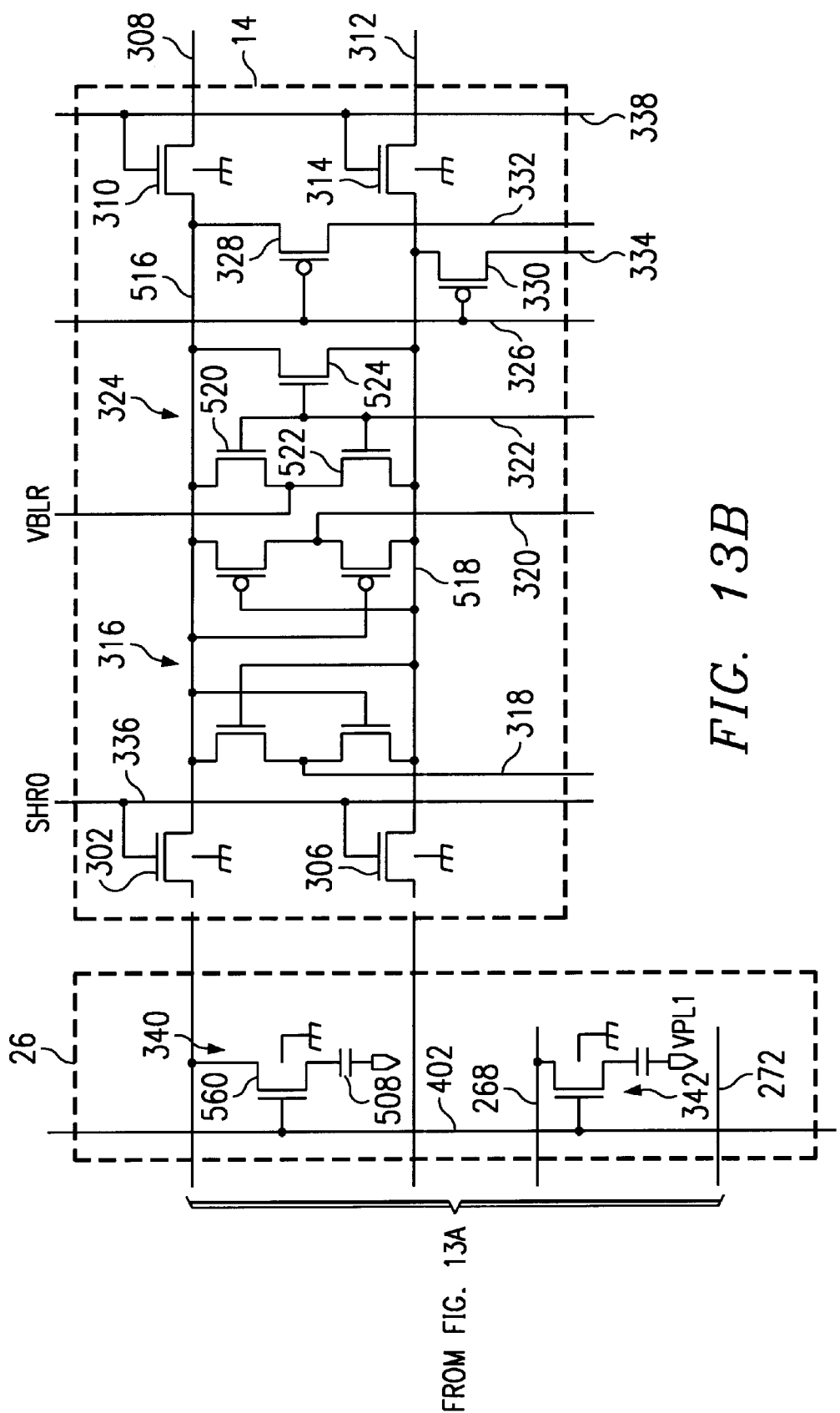

In this regard, FIG. 13 is a view similar to FIG. 8, but showing the circuitry within the standard sense amplifiers 14 and 16 and the local sense amplifier 20, and also showing circuitry within each of the memory cells 340, 342, 502 and 504. The memory cell 340 includes a transistor 506 coupled between the bitline 260 and one end of a capacitor 508, the opposite end of the capacitor 508 being coupled to a reference level VBLR. The gate of the transistor 506 is coupled to a wordline 402, which is a decoded address line that can select a row of memory cells in the memory cell array 26, such as the row which includes the memory cells 340 and 342. The other memory cells are similar to the memory cell 340, and in this regard it will be noted that the memory cell 502 includes a transistor 510 and a capacitor 512. The gate of transistor 510 is coupled to a wordline 514 of the memory cell array 28.

The standard sense amplifier 14 has two transistors or share gates 302 and 306 which are simultaneously controlled by a common share signal SHR0 provided on a line 336. The gates 302 and 306 selectively permit the sense amplifier 14 to communicate with the memory cell array 26, or electrically isolate the sense amplifier 14 from the memory cell array 26. On a more specific level, the gate 302 permits or interrupts electrical communication between a bitline 516 in the sense amplifier 14 and a bitline 260 in the memory cell array 26, and the gate 306 selectively permits and interrupts electrical communication between a bitline 518 of the sense amplifier 14 and a bitline 264 of the memory cell array 26. In a similar manner, the sense amplifier 14 has two further transistors 310 and 314 serving as share gates which selectively permit or prevent the sense amplifier 14 from communicating with a further memory cell array which is not shown in FIG. 13, and which is disposed on the right side of the sense amplifier 14.

In an analogous manner, the local sense amplifier 20 has a pair of transistors 262 and 266 which selectively permit and prevent the local sense amplifier 20 from electrically communicating with the bitlines 260 and 264 in the memory cell array 26, the transistors 262 and 266 being controlled by a common share control signal SHR2 on line 256. The local sense amplifier 20 has two further transistors 270 and 271 which selectively permit and prevent the local sense amplifier 20 from communicating with the bitlines 268 and 272 in the memory cell array 26, based on a share control signal SHR1 on line 258. The local sense amplifier 20 has yet another pair of transistors 234 and 238 which are controlled by a common share signal SHR3 on line 250, and which selectively permit and prevent the local sense amplifier 20 from electrically communicating with the pair of bitlines 232 and 236 which are disposed in the memory cell array 28 and which are associated with an array of memory cells that includes the memory cell 502. Further, the local sense amplifier 20 has a pair of transistors 242 and 246 which are controlled by a common share signal SHR4 on line 248, and which selectively permit and prevent the local sense amplifier 20 from electrically communicating with a further pair of bitlines 240 and 244 in the memory cell array 28.

If the memory cell 340 is currently storing a logic zero, then the capacitor 508 will be charged to a logic low voltage, whereas if the memory cell 340 is currently storing a logic one, the capacitor 508 will be charged to a logic high voltage. The same is true of the capacitor in every other memory cell, including the memory cell 502.

In between read operations, write operations and refresh operations, the state of the memory circuitry shown in FIG. 13 is as follows. The share control signals on lines 338, 336, 258, 256, 250 and 248 will all be actuated, so that the associated share gates will all be conductive. An equalization enable signal provided on a line 322 is actuated, in order to turn on three transistors 520, 522 and 524 of an equalization circuit 324.

The transistors 520 and 522, when actuated, supply to each of the bitlines 516 and 518 a predetermined reference voltage VBLR, which is approximately half the voltage to which the capacitors in the memory cells are charged in order to represent a logic one. In other words, the voltage VBLR is approximately halfway between the capacitor voltages for a logic one and a logic zero. Thus, bitlines 516 and 518 will both be equalized to the intermediate voltage VBLR. The transistor 524 helps facilitate the voltage equalization between bitlines 560 and 518. Moreover, through the various enabled share gates, the voltage equalization between these bitlines will be supplied to the bitlines throughout the circuits to be shown in FIG. 13.

In particular, through gates 302 and 306, the bitlines 260 and 264 will both be equalized to the intermediate voltage VBLR, and through gates 262 and 266 the two bitlines 252 and 254 in the local sense amplifier 20 will both be equalized to the intermediate voltage VBLR. Through gates 234 and 238, the bitlines 232 and 236 in memory cell array 28 will both be equalized to the intermediate voltage VBLR, and the bitlines 240 and 244 in memory cell array 28 will also both be equalized to intermediate voltage VBLR through the enabled gates 242 and 246. Further, the bitlines 268 and 272 in the memory cell array 26 will both be equalized to intermediate voltage VBLR through the gates 270 and 271. Two control lines 318 and 320 will be maintained at the intermediate voltage VBLR, and a control line 326 will be set to turn off the transistors 328 and 330. This condition of the circuit is known as the precharge condition.

In order to do a read operation with respect to the memory cell 340, when the circuitry of FIG. 13 is in the precharge state, the following occurs. The equalization enable signal on line 322 is deactuated, to turn off the transistors 520, 522 and 524. The share signal on line 338 is deactuated to turn off transistors 310 and 314, in order to isolate the sense amplifier 14 from the not-illustrated memory cell array which is to the right of sense amplifier 14 in FIG. 13. Further, the share control signal SHR2 on line 256 is deactuated, to turn off the transistors 262 and 266 in order to isolate the memory cell 340 and the memory cell array 26 from the local sense amplifier 20. The bitlines 516 and 518 of the sense amplifier 14 remain respectively coupled to the bitlines 260 and 264 of the memory cell array 26, all of these bitlines still being precharged to the intermediate voltage VBLR. The wordline 402 is then actuated or "fired" in order to turn on transistor 506 and thus couple capacitor 508 to the bitline 260. The capacitance of capacitor 508 is substantially less than the combined capacitance of the bitlines 260 and 516. For example, the capacitance of capacitor 508 may be approximately ⅕ of the combined capacitance of bitlines 260 and 516. Nevertheless, the capacitance of capacitor 508 is sufficient that the charge thereon will tend to alter the charge on the bitlines 260 and 516 relative to the bitlines 264 and 518.

In particular, if the capacitor 508 is storing a logic zero voltage, the voltage on bitlines 260 and 516 will be pulled downwardly a small amount from the intermediate voltage VBLR, whereas if the capacitor 508 is storing a logic one voltage it will cause the voltage on bitlines 260 and 516 to be increased a small amount above the intermediate voltage VBLR. The bitlines 264 and 518 will, of course, remain at the precharge intermediate voltage VBLR. Thus, after transistor 506 has been turned on, there will be a small positive or negative voltage differential between the bitline 260 and the bitline 264, and thus between the bitline 516 and the bitline 518.

After a brief delay from the actuation of wordline 402, which gives this voltage differential time to develop, the control lines 318 and 320 for the sense amplifier circuit 316 are actuated or "fired". More specifically, the control line 318 is decreased from the intermediate voltage VBLR to ground, and the control line 320 is increased from the intermediate voltage VBLR to a logic high voltage. The four transistors of the sense amplifier circuit 316 form a pair of cross-coupled inverters. That is, the sense amplifier circuit 316 will detect the polarity of the voltage differential between the bitlines 516 and 518, and will then drive one of these bitlines to a logic one voltage and the other to logic zero voltage, depending on the detected polarity.

More specifically, if the voltage differential is such that the voltage on bitline 516 is slightly higher than the voltage on bitline 518, the sense amplifier circuit 316 will amplify this differential by driving bitline 516 to a logic one voltage and bitline 518 to a logic zero voltage. In contrast, if the voltage differential is such that the voltage on line 516 is slightly less than the voltage on line 518, the sense amplifier circuit 316 will amplify this differential by driving bitline 516 to a logic zero and bitline 518 to a logic one. The result is that capacitor 508 will be refreshed to a fully charged or discharged logic state, corresponding to the logic state which it had at the time the wordline 402 was fired.

Then, the Y select or column select line 326 will be enabled, to turn on the transistor pair 328 and 330. This couples the bitlines 516 and 518 respectively to lines 332 and 334, which are a differential signal pair representing a bidirectional data line. The transistors 328 and 330 thus function as a data transfer circuit, or data input/output circuit. A remote and not-illustrated circuit can then read and store the logic one or logic zero which the sense amplifier circuit 316 is driving onto the differential data lines 332 and 334, and which represents a duplicate of the bit of binary information stored on the capacitor 508. Thereafter, the read operation is completed by turning off the column select line 326, deactuating the wordline 402 in order to isolate capacitor 508 and the charge now stored thereon, returning both of the control lines 318 and 320 to the intermediate voltage VBLR, actuating the share control lines 338 and 256 in order to re-enable transistors 310, 314, 262 and 266, and then actuating the equalization enable signal on line 322 in order to reenable the transistors 520, 522 and 524 so that the bitlines throughout the circuitry in FIG. 13 are again all equalized to the intermediate voltage VBLR, thereby returning the circuitry to its precharge state.

The operational sequence used to write a bit to the memory cell 340 is substantially identical to the sequence just described for reading a bit from memory cell 340, with one difference. More specifically, at the point in the sequence where the column select line 326 is enabled in order to turn transistors 328 and 330 on, the external circuitry coupled to bidirectional datalines 332 and 334 does not sense and save the differential voltage between them, but instead positively drives these lines with a differential voltage having a polarity representing either a logic high or a logic low. The external circuit must drive the lines 332 and 334 with sufficient power to overdrive the sense amplifier circuit 316 so that, if the state of sense amplifier 316 is the inverse of the state which is to be stored in the memory cell 340, the sense amplifier circuit 316 will switch states and then drive the bitlines 516 and 518 to the logic state which was supplied by the external circuit on lines 332 and 334. Regardless of whether or not the sense amplifier circuit 316 is forced to change state, it will end up amplifying the logic high or logic low which was provided through the bidirectional data pair 332 and 334, and thus charge the capacitor 508 to a logic low or a logic high, as appropriate. The write operation is then completed in the same manner as a read operation.

The manner in which the sense amplifier 14 can read the memory cell 502 through the local sense amplifier 20 will now be described. This read operation also begins from the precharge state of the circuitry shown in FIG. 13. It will be noted that the local sense amplifier 20 has a sense amplifier circuit 292 which is similar to the sense amplifier circuit 316 of the sense amplifier 14. The local sense amplifier 20 does not, however, have a precharge circuit similar to the circuit 324 in sense amplifier 14, and does not have a data input/output circuit similar to this transistors 328 and 330 of sense amplifier 14. The local sense amplifier 20 relies on the circuitry within the sense amplifier 14 for these latter functions, in a manner which now will be described.

A read of the memory cell 502 begins with deactuation of the equalization enable line 322, in order to disable the equalization circuit 324. The share signal on line 338 is deactuated to turn off transistors 310 and 314, in order to isolate the sense amplifier 14 from the not-illustrated memory cell array which is to the right of sense amplifier 14 in FIG. 13. The share control lines 248, 256 and 258 are each then disabled, in order to electrically isolate the local sense amplifier 20 from the bitline pair 240 and 244, the bitline pair 268 and 272, and the bitline 260 and 264. The bitlines 252 and 254 of the local sense amplifier 20 are thus coupled only to the bitlines 232 and 236 associated with the memory cell 502 in the memory cell array 28. The wordline 514 is then actuated or "fired", in order to turn on transistor 510 and thus couple the capacitor 512 to the bitline 232. In a manner similar to that described above in association with memory cell 340, the capacitor 512 will cause a small positive or negative voltage differential to develop between bitlines 232 and 236, and thus between bitlines 252 and 254. The control lines 276 and 280 for the sense amplifier circuit 292 have both been maintained so far at the intermediate voltage VBLR but are now actuated or "fired". In particular, the control line 276 is driven from the intermediate voltage VBLR to a logic low voltage, and the control line 280 is driven from the intermediate voltage VBLR to a logic high voltage. This causes the sense amplifier circuit 292 to detect and amplify the voltage differential, in a manner similar to that described above for sense amplifier circuit 316. This recharges the capacitor 512 to the logic high or logic low voltage corresponding to the state which it had when the transistor 510 was turned on.

Thereafter, the shareline 256 is enabled, in order to couple the bitlines 252 and 254 of local sense amplifier 20 to the bitlines 260 and 264 in memory cell array 26, and to the bitlines 516 and 518 in the sense amplifier 14. The control lines 318 and 320 for the sense amplifier circuit 316 are then "fired", so that the sense amplifier 316 senses and amplifies the same logic state which is already being amplified by the sense amplifier circuit 292. Then, the column select line 326 is enabled in order to turn on transistors 328 and 330, so that the logic state being driven onto bitlines 516 and 518 by the sense amplifier circuit 292 and 316 is driven out onto the lines 332 and 334 of the bidirectional differential data pair. The not-illustrated remote circuit can then sense and store the logic state which is present on lines 332 and 334, and which corresponds to the bit of binary information stored on capacitor 512.

Thereafter, the read operation is completed by deactuating the column select line 326, deactuating the wordline 514 in order to isolate the capacitor 512 and the logic voltage stored thereon, and by returning all of the control lines 276, 280, 318 and 320 for the sense amplifier circuits 292 and 316 to the intermediate voltage VBLR. Then, the share control lines 248, 258 and 338 are enabled, so that all the share gates in the circuitry of FIG. 13 are again enabled. The equalization enable line 322 is then again actuated in order to actuate the equalization circuit 324, so that all of the bitlines throughout the circuitry of FIG. 13 will again be returned to the intermediate voltage VBLR, thereby returning the circuitry of FIG. 13 to its original precharge state.

The manner in which data is written to the memory cell 502 is generally similar to that described for a read operation, up to the point where the control lines 318 and 320 for the sense amplifier circuit 316 are fired. In particular, after the control lines 318 and 320 have been fired so that the sense amplifier circuit 316 detects and amplifies the logic state which is already being amplified by the sense amplifier circuit 292, the share control lines 250 and 256 are disabled, in order to isolate the memory cell array 28 from the local sense amplifier 20, and from the sense amplifier 14 and the memory cell array 26. The column select line 326 is then actuated in order to turn on transistors 328 and 330, and the external circuit drives the bidirectional data pair 332 and 334 with a differential voltage sufficient to invert the state of the sense amplifier circuit 316, if necessary.

Once the sense amplifier circuit 316 has detected and is amplifying the logic state being supplied to the sense amplifier 14 through the data lines 332 and 334, the share control line 256 is actuated in order to couple the sense amplifier 14 through the memory cell array 26 to the local sense amplifier 20, so that the sense amplifier circuit 292 detects and amplifies the same logic state as the sense amplifier circuit 316, which if necessary involves inversion of the state of the sense amplifier circuit 292.

Thereafter, the share control line 250 is again actuated, so that the local sense amplifier 20 is coupled to the bitlines 232 and 236 of memory cell array 28, causing the capacitor 512 to be charged to a logic high voltage or logic low voltage corresponding to the logic state being amplified by sense amplifier circuits 292 and 316. Thus, the bit of binary information provided by the external circuit on lines 332 and 334 has been written to the capacitor 512. The column select line 326 is then disabled, and the wordline 514 is disabled in order to isolate capacitor 512. The control lines 276, 280, 318 and 320 for the sense amplifier circuits 292 and 316 are then all returned to the intermediate voltage VBLR, and all of the deactuated share control lines 248, 258 and 338 are actuated, so that all of the share gates in the circuitry of FIG. 13 are enabled. The equalization enable control line 322 is then reactuated, in order to enable the equalization circuit 324, which returns all of the bitlines in the circuit of FIG. 13 to the intermediate voltage VBLR, or in other words to the original precharge state of the circuit in FIG. 13.

Figure 2:
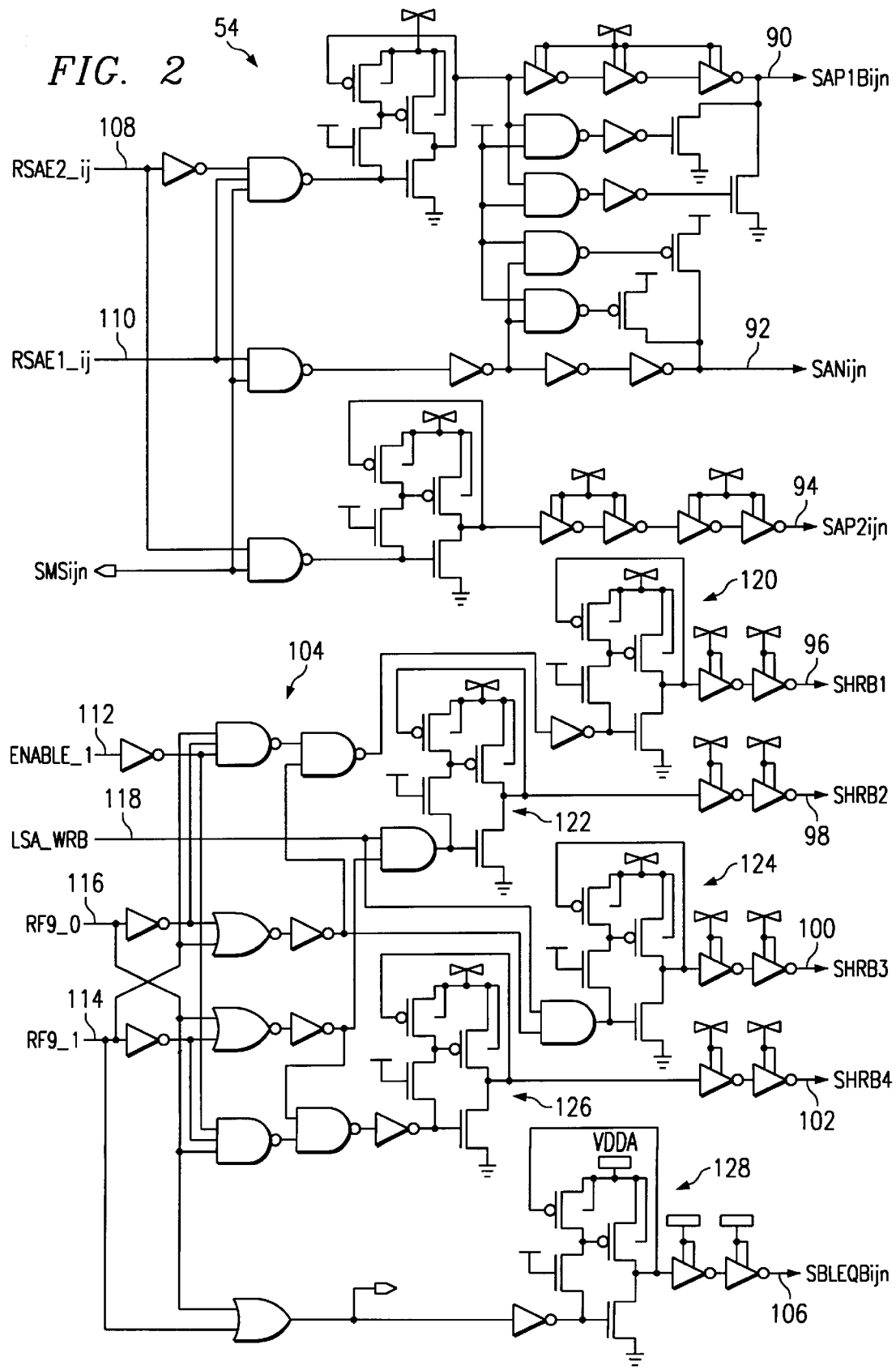
FIG. 2 is a schematic diagram of array control circuitry which is part of the memory array circuit of FIG. 1.

FIG. 2 illustrates a more detailed view of the array control circuit 54 (FIG. 1) for local sense amplifiers 20 and 22. Outputs from array control circuit 54 include sense amplifier activation output line 90 that goes to the P-channel sense amp driver switch for local sense amplifiers 20 and 22. Output line 92 goes to the N-channel sense amp driver switch of local sense amplifiers 20 and 22. Output line 94 provides an input for the overdrive sensing circuitry within the intersection area circuits 48, 50 for the local sense amplifiers. The overdrive circuitry speeds up the sensing operation of local sense amplifiers 20 and 22. Additional outputs from array control circuit 54 include SHR gate outputs on lines 96, 98, 100 and 102. The SHR gates control the connection of the sense amplifier 22 to the bitlines of memory array circuits 24 and 30.

Logic circuitry 104 details the sense amplifier bank to make possible the local sense amplifier architecture of the present invention. Bitline equalization output 106 provides input to the intersection area circuits 48, 50 to provide necessary bitline equalization inputs to local sense amplifiers 20 and 22. Lines 108 and 110 provide the pathway for the activation signal for local sense amplifiers 20 and 22. Line 112 receives the signal for enabling the SHR gates within local sense amplifiers 20 and 22. Lines 114 and 116 receive the address signals for decoding the local sense amplifier address that the memory array circuitry 10 is addressing within arrays 24, 26, 28 or 30. Line 118 receives the input for the local sense amplifier write operation. Level shifter circuits 120, 122, 124, 126 and 128 receive a $V_{PERI}$ signal and shift that level to a $V_{PP}$ output for local sense amplifiers 20 and 22.

Figure 3:
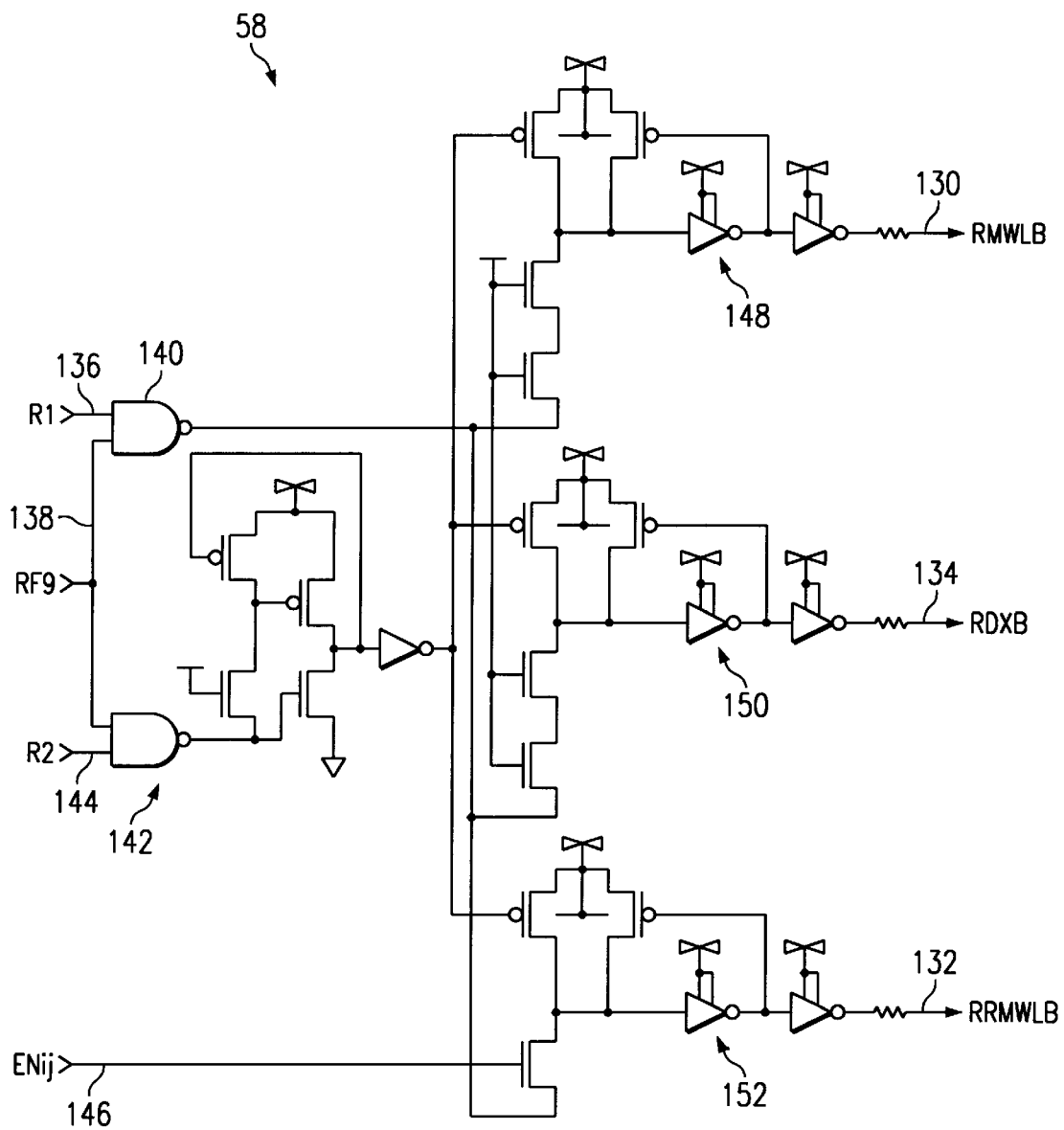
FIG. 3 is a schematic diagram of a main word decoder circuit which is part of the circuit of FIG. 1.

FIG. 3 illustrates a more detailed electrical schematic diagram of main word decoder circuits 58 and 60 of FIG. 1. Outputs from main word decoder circuit 58 include main word line output 130, for providing a main word line output to sub-word line decoder 36, redundant main word line output 132 for providing a redundant main word line output to sub-word line decoder 36, and RDX output 134, which activates sub-word line decoder 36, for example. Inputs to main word line decoder 58 include row clock input 136, and address input 138, which feed NAND gate 140 and also decoder and level shifter circuit 142, to further decode the row address for the main word line.

Line 144 also provides a row clock input to decoder circuit 142. Line 146 provides a redundant enable input to provide a redundant enabled signal input to main word decoder circuit 58. Buffer circuits 148, 150 and 152 serve as buffers for the main word line output to drive the large capacitive load that would otherwise exist on the main word 130, 132 and RDX 134 lines.

Main word line decoder 58 makes possible the implementation of a hierarchial word line scheme. Using main word line decoder 58, the main word line operates across the row of each of the memory arrays. In operation, the main word line is fired across the array and on selected array mats, certain RDXB line 134 energizes. Further decoding occurs in sub-word decoding circuits 36 and 38.

Figure 4:
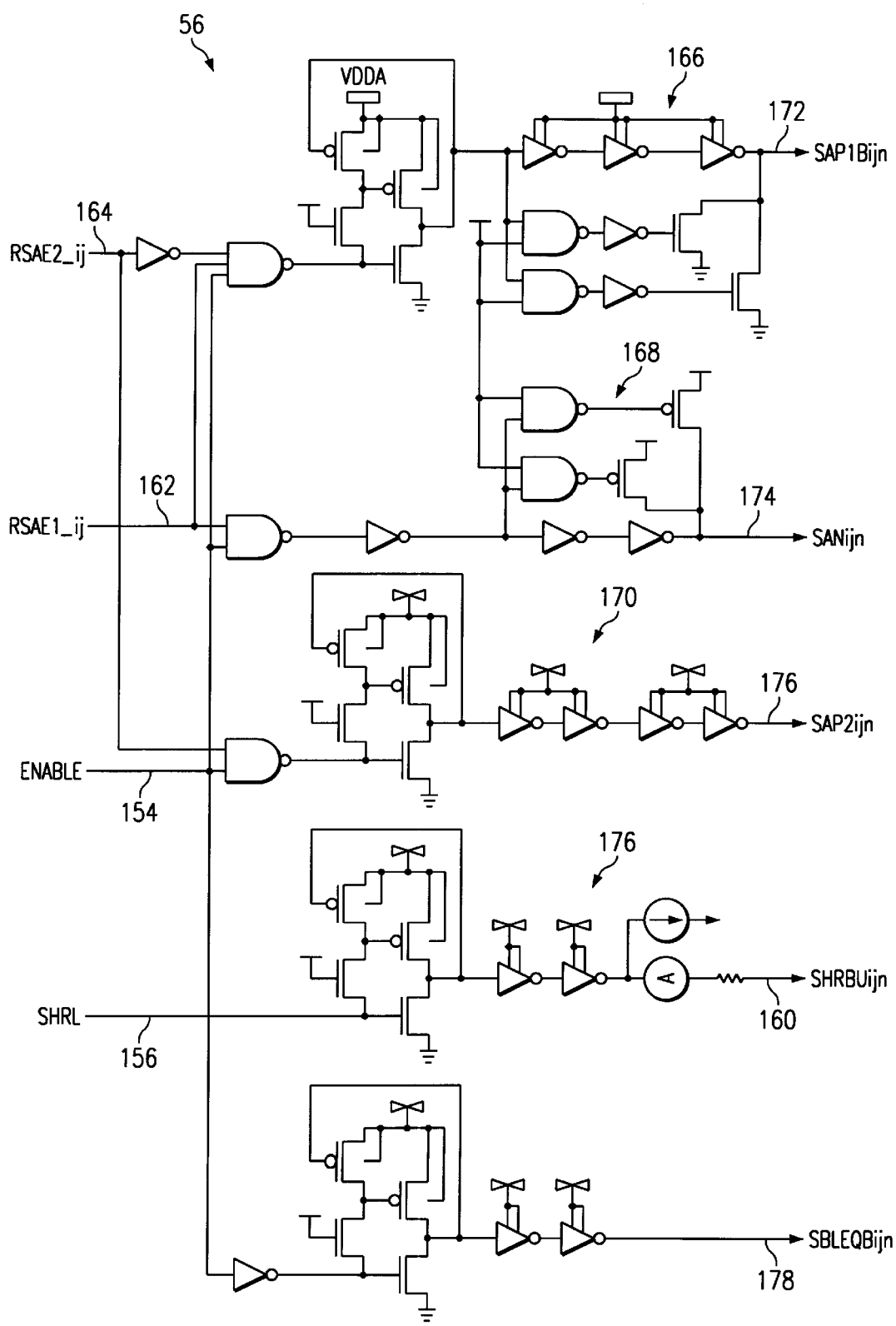
FIG. 4 is a schematic diagram of a further array control circuit which is part of the circuit of FIG. 1.

FIG. 4 illustrates array control circuit 52, which receives sense amplifier enable input on line 154, to enable the sense amplifiers 12 and 14, for example. Line 156 receives the SHR gate input, which level shifter and buffer circuit 158 buffers, and which drives the line 160 to the intersection area buffers for sense amplifier 16, for example. Lines 162 and 164 receive sense amplifier enable inputs that go to buffer circuits 166 and 168. Outputs on lines 172, 174 and 176 correspond respectively to the outputs on lines 90, 92 and 94 of local sense amplifier intersection area circuit 48 of FIG. 2. Line 178 provides bitline equalization for the intersection area circuits 40, 42, 44, 46. The output on line 160 activates the SHR transistors between the connection of the bitlines and the sense amplifier 16, for example.

Figure 5:
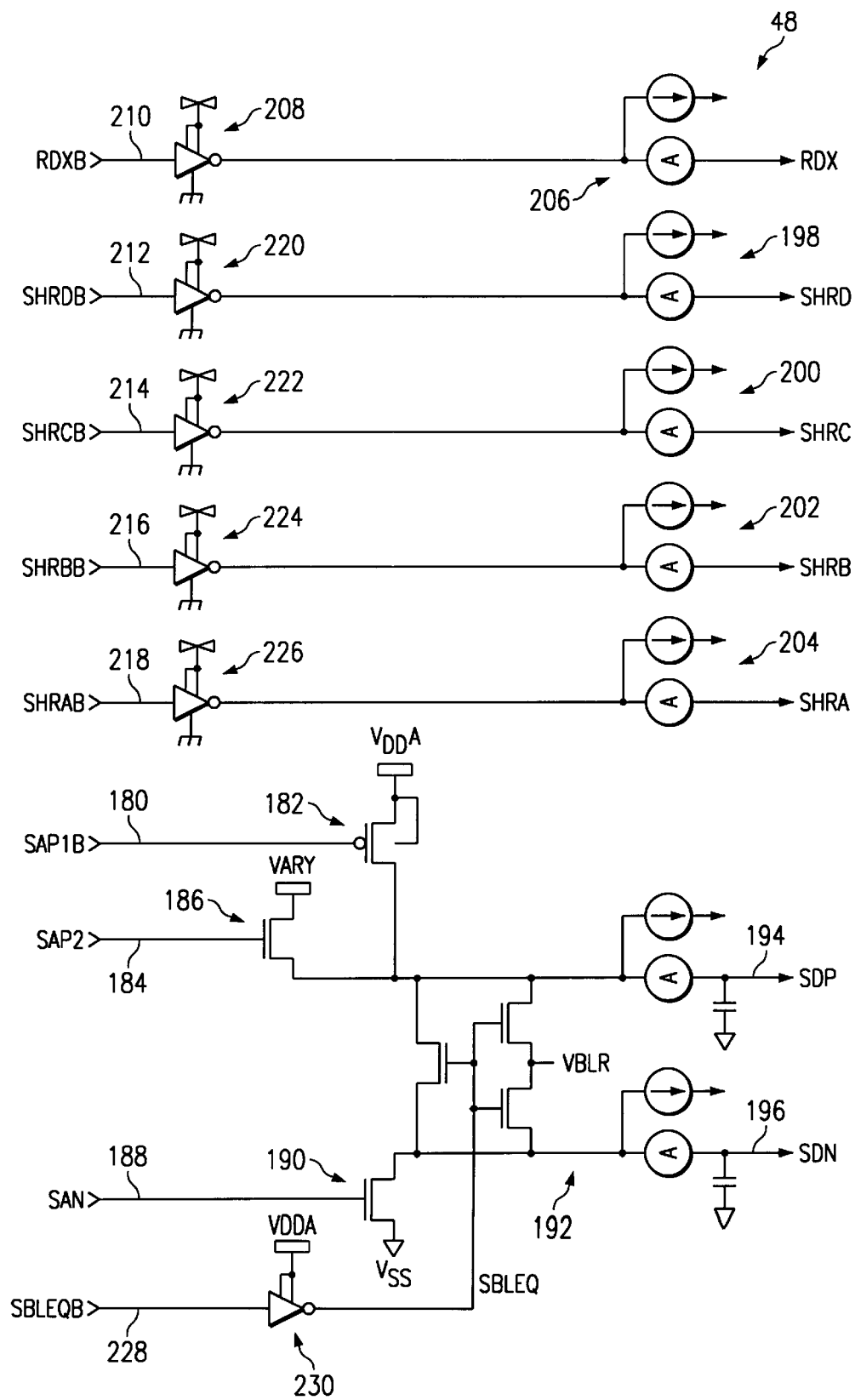
FIG. 5 is a schematic diagram of an intersection area circuit which is a part of the circuit of FIG. 1.

FIG. 5 illustrates one embodiment of intersection area circuit 48, for example, for local sense amplifiers 20 and 22. Local sense amplifier intersection area circuit 48 includes a plurality of buffers to drive the SHR gates across memory cell array 30, for example, in response to the output from local sense amplifier control circuit 54. Input to local sense amplifier intersection circuit 48 includes sense amplifier P-channel sense amp overdrive control input 180 that goes to transistor 182, and an input on line 184 goes to the sense amp drive N-channel transistor 186. Moreover, input on line 188 goes to N-channel sense amp drive transistor 190. Circuit 192 provides the sense amp P-channel supply (SDP) on line 194 and line 196 provides the sense amp N-channel supply (SDN) at 196 to go to local sense amplifiers 20 and 22.

Local sense amplifier intersection circuit 48 also includes SHR signals 198, 200, 202 and 204. Signal 206 from buffer 208 is an inverted RDXB input on line 210 from main word decode circuit 58, to activate the sub-wordline. Input on lines 212, 214, 216 and 218 come from array control circuit 54, and respectively go to buffers 220, 222, 224, 226 to generate inputs to SHR gates 198, 200, 202 and 204. Line 228 provides bitline equalization input to buffer 230, to provide the necessary bitline equalization for sense amp driver circuit 192 to equalize the SDP and SDN sense amp supply outputs on lines 194 and 196, respectively. The function that represents an intersection circuit 48 is for providing power to the local sense amplifier circuits 20 and 22, as well as buffering the SHR signals.

Figure 6:
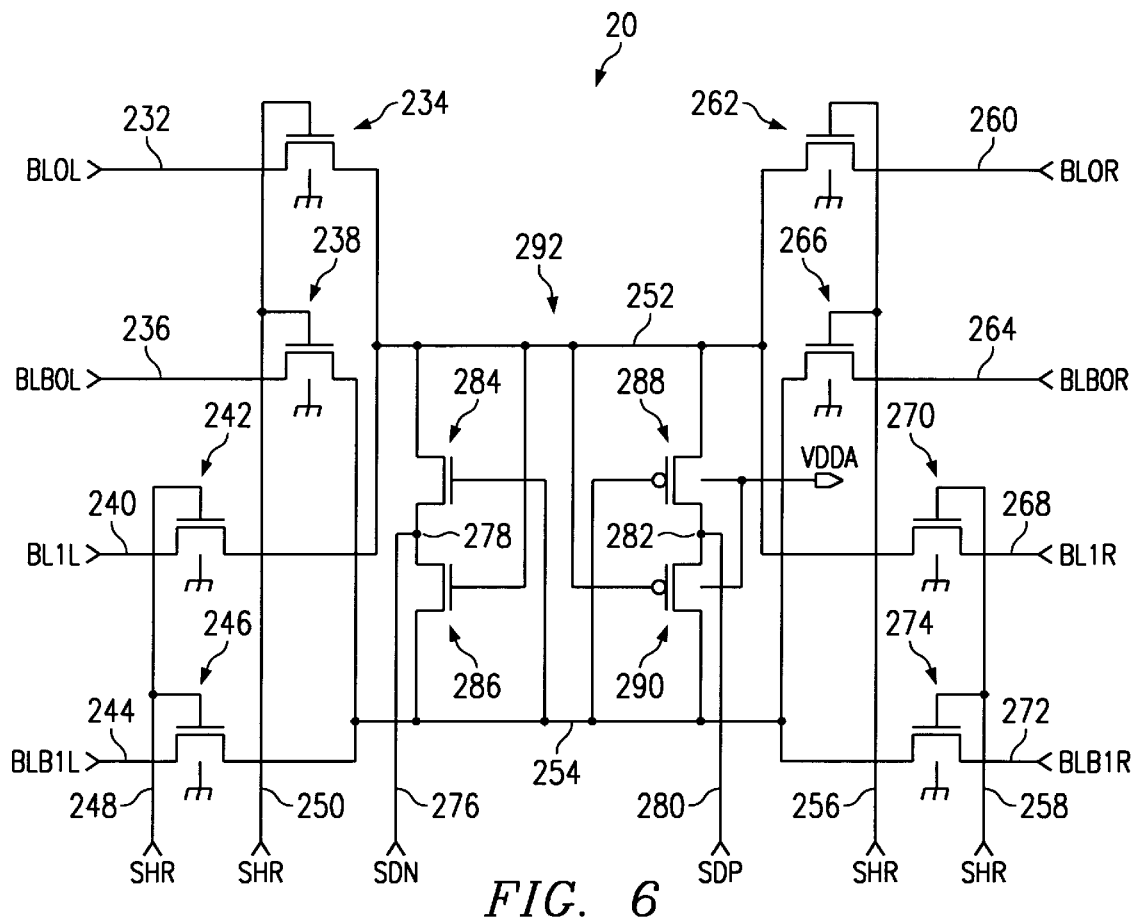
FIG. 6 is a schematic diagram of a local sense amplifier cell which is part of the circuit of FIG. 1.

FIG. 6 provides a detailed schematic drawing of a local sense amplifier cell, such as the local sense amplifier cell 20 of FIG. 1. Inputs to local sense amplifier cell 20 include BL0L on line 232 that goes to transistor 234. BLB0L input on line 236 goes to transistor 238. Line 240 provides BL1L input to transistor 242; and line 244 provides BLB1L input to transistor 246. Input on lines 232, 236, 240 and 244 come from array 28 of FIG. 1, for example.

Transistors 234, 238, 242 and 246 operate as SHR gates in response to input on lines 248 for transistors 242 and 246, and on line 250 for transistors 234 and 238. Transistors 234 and 238, or 242 and 246, turn on in order to connect the bitlines to the sense amplifiers. This provides input to line 252, when BL0L input on line 232 or BL1L input on line 240 are connected to line 252, depending on the state of SHR lines 248 and 250. Line 254 receives BLB0L input from line 236 or BLB1L input from line 244. Thus, for local sense amplifier 20 there are four SHR inputs, two SHR inputs on the left side on lines 248 and 250 described above. Also, two SHR inputs enter on the right side of local sense amplifier cell 20 as SHR line 256 and SHR line 258.

On the right hand side of local sense amplifier cell 20, BL0R bitline 260 provides a bitline input to SHR transistor 262, BLB0R bitline 264 provides a path for input to flow to SHR transistor 266. BL1R bitline 268 provides input to SHR transistor 270, and BLB1R bitline 272 provides input to SHR transistor 274.

In response to the logic high value on SHR line 256, BL0R input goes to SHR transistor 262 and then to line 252. The BLB0R input, according to the same value of the signal on line 256, goes to the line 254. From BL1R bitline 268, SHR transistor 270, according to the logic high value on SHR line 258, may provide input to line 252. Similarly, BLB1R line 272 may pass through SHR transistor 274 to line 254. In both cases, the logic state of the SHR lines are mutually exclusive; only one SHR line per side can assume the logic state high, never both when there is a wordline active in the memory array on either side of local sense amplifier 20.

SDN line 276 provides SDN input to node 278. SDP line 280 provides SDP input to node 282. Thus, SDN line 276 provides a voltage to N-channel transistors 284 and 286, while SDP line 280 provides a voltage to P-channel transistors 288 and 290. Transistors 284, 286, 288 and 290 form a sense amp or cross-coupled inverter that initially equalizes SDN and SDP voltages for lines 276 and 280 by virtue of a bitline equalization voltage which is set at one-half the bitline voltage swing. At this point, the value of the voltages of N1 line 252 and that of N2 line 254 are equal.

Prior to activation, the SHR signal bias on SHR gate transistors 234, 238, 242, 246, 262, 266, 270, and 274 are all high. Thus, the bitline levels will be equal to the values of the voltages on line 252 and line 254. When a sensing operation is about to take place, the unneeded bitlines are isolated from the local sense amp by shutting the SHR lines off. At the point when sensing is to take place, for example when a storage capacitor attached on BL0L contains a logic "1" level, the input on line 232 is to be sensed by the local sense amp, because SHR gate transistor 234 is on. Consequently the bitline voltage on line 232 will go up above the bitline precharge level plus a positive signal level. This causes the voltage on N1 line 252 to increase. The BLB0L input on BLB0L bitline 236 will stay at its same bitline precharge voltage level since no storage capacitor is connected to it. This will cause the line 254 voltage to remain constant at the bitline reference voltage value.

The difference in voltage between line 252 and line 254, followed by the activation of the sense amp by powering the SDN 276 and SDP 280 lines to $V_{SS}$ and $V_{DD}$ respectively, causes the value of the voltage on SDN line 276 to go low toward $V_{SS}$. The voltage value on line 280 will go to voltage $V_{DD}$ initially, and then once SAP1B 180 resets high and SAP2 184 goes high in FIG. 5, node 252 will settle to the regulated array voltage VARY. These events will ultimately cause the voltage difference between line 252 and line 254 to increase to the point where the voltage difference approaches the regulated array voltage value.

Eventually, therefore, the line 252 value will equal the array voltage, and the line 254 voltage will equal $V_{SS}$ or 0. These levels will then propagate into the bitlines through the SHR transistors 234 and 238. This will cause the value on BL0L bitline and the accessed memory cell 232 to be restored to the array voltage. The voltage value for the BLB0L bitline 236 will return to the reference voltage 0. This ultimately refreshes the cell in the associated array 30, for example.

FIG. 7 shows sense amplifier cell 14 which is equivalent to sense amplifier cells 12, 16, and 18, all of FIG. 1. Inputs to sense amplifier cell 16 include BL bitline input on BLL bitline 260 that goes to SHR transistor 302. Complement bitline input on BLBL bitline 264 goes to SHR transistor 306. Symmetrical BL input on BLR bitline 308 goes to SHR transistor 310, and BL input on line 312 to SHR transistor 314.

Note the distinction between sense amplifier cell 14 of FIG. 7, and local sense amplifier cell 20 of FIG. 6. In sense amplifier cell 14, each side receives one pair of complementary bitlines per sense amp pitch. Conversely, local sense amplifier cell 20 receives two pairs of complementary bitlines on each side per sense amp pitch. Circuit 316 of sense amplifier cell 14 is similar in structure and function to circuit 292 of local sense amplifier cell 20. Sense amplifier cell 14 also receives SDN input on line 318, and SDP input on line 320, as does local sense amplifier cell 20. However, in addition sense amplifier cell 14 must receive a bitline equalization input on line 322 for bitline equalization circuitry 324. Sense amplifier cell 14 also receives Y-select input on line 326. The Y-select circuitry includes transistors 328 and 330, which respectively transmit input from array I/O lines 332 and 334. Moreover, sense amplifier cell 14 receives SHR gate input on SHRL line 336 for SHR gate transistors 302 and 306. SHR gate input on SHR line 338 goes to SHR gate transistors 310 and 314. The number of SHR gates existing in local sense amplifier cell 20 is also different from that appearing in sense amplifier cell 16 of FIG. 7.

Note that in local sense amplifier cell 20 of FIG. 6, there are eight SHR gate transistors, 234, 238, 242, 246, 262, 266, 270 and 274. In contrast, sense amplifier cell 16 has only four SHR gate transistors 302, 306, 310 and 314. Because local sense amplifier cell 20 does not include bitline equalization circuitry 324 and Y-select circuitry 328, 330, appreciable sense amp size savings can occur despite the increase in the number of additional SHR gate transistors.

FIG. 8 provides an illustrative example of how a memory cell in memory cell array 24 is accessed, to show the power reduction advantage the present invention provides. Referring to FIG. 8, there is shown the sense amplifier cell 16 and the sense amplifier cell 14, with the local sense amplifier cell 20 therebetween. BL0 line 260 connects between sense amplifier cell 14 and local sense amplifier cell 20 in memory cell array 26, with BL0end line 232 connecting from local sense amplifier cell 20 into memory cell array 28. Also, BL0_ bitline 264 connects between sense amplifier cell 14 in memory cell array 26 and local sense amplifier cell 20, with BL0end_ line 236 connecting from the local sense amplifier 20, also into memory cell array 28.

BL1 line 240 and BL1_ line 244 connect between sense amplifier cell 14 and local sense amplifier cell 20 through memory cell array 28. BL1end line 268 and BL1end_ line 272 connect from local sense amplifier 20 into memory array 26. In the illustrated example, bit 340 in memory cell array 26 may be accessed through wordline 402 onto bitline BL0 line 260 to sense amp 14. Bit 342 may be accessed by BL1end line 268 through wordline 402. In order to access bit 340, sense amplifier 14 is activated, but not sense amplifier cell 16. Activating sense amplifier cell 14 activates BL0 line 260 and BL0_ line 264.

In order to access bit 342, for example, BL1end 268 and BL1end_ 272 lines are energized. This will require activating the local sense amplifier cell 20, while turning off SHR lines SHR1 (256), SHR3 (250), SHR4 (248), and SHR6

(408). As soon as the local sense amplifier cell 20 resolves the storage cell level, SHR4 248 turns back on and sense amplifier 16 is activated to resolve the cell level on BL1 240 and the state of the local sense amplifier 20, to output the cell state on the array I/O lines 320 and 318 through the Y-select devices. The result is a significant power savings when compared to the necessary power consumption for known sense amplifier architectures, since it is not necessary to consume current to sense and drive the unaccessed bitline segments BL0end 232 and BL0end_ 236 in the preceding example.

Local sense amplifier cell 20 is placed equidistant from sense amplifier cell 14 and sense amplifier cell 16. The result is a reduction in the overall length of each bitline, and a consequent reduction in the capacitance of the bitline segments. This translates to improved speed and lower power consumption. Therefore, because the architecture of the present invention provides the ability to reduce peak current consumption during sensing by as much as 25 percent, the on-chip supply line widths may reduce to decrease the chip size.

Figure 9:
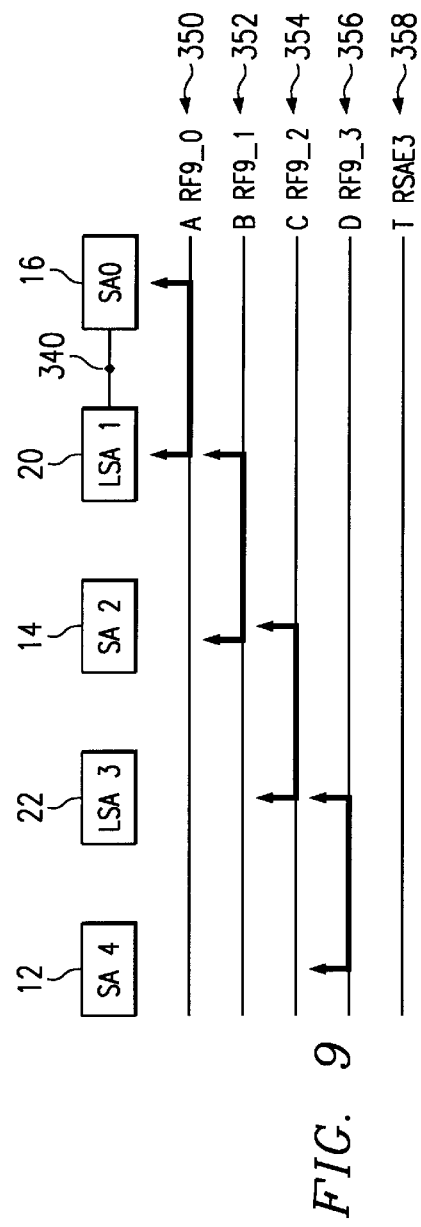
FIG. 9 is a diagram showing the sequential coordinated activation of sense amplifiers and local sense amplifiers in the circuit of FIG. 1.

Activating the local sense amplifier and sense amplifier architecture of the present invention may be understood with reference to FIGS. 1 and 9. Referring to FIG. 1, initially, inputs to local address decode circuit 62 include row factor RF9_0 line 350, RF9_1 line 352, RF9_2 line 354, RF9_3 line 356 and sense amp activation clock signal RSAE3 on line 358. Local address decode circuit 64 also receives inputs from RF9_0 line 350, RF9_1 line 352 and RSAE3 line 358. Main word decoder 58 receives input from RF9_0 line 350 and main word decoder circuit 60 receives input from RF9_1 line 352, since RF9 is used to decode the wordline activation between memory arrays. Local sense amplifier array control circuit 54 receives inputs from RF9_0 line 350, RF9_1 line 352, and Enable_T local sense amp activation clock signal line 360.

FIG. 9 is a diagram which illustrates the sequential coordinated activation of the sense amp/local sense amplifier architecture of the present invention. FIG. 9 shows three sense amplifier cells 12, 14, and 16, with reference numerals corresponding to sense amplifiers appearing in the exemplary circuit diagram of FIG. 1. Activation lines A, B, C, D, and T have corresponding row factor and sense clock lines in FIG. 1, which are respectively RF9_0 line 350, RF9_1 line 352, RF9_2 line 354, RF9_3 line 356, and RSAE3 line 358.

In FIG. 9, line A depicts that initially RF9_0 line 350 is activated in order to activate sense amplifier cell 16 and local sense amplifier cell 20. Line B shows that RF9_1 line 352 activates local sense amplifier cell 20 and sense amplifier cell 14. Line C shows that RF9 2 line 354 activates sense amplifier cell 14 and local sense amplifier cell 22. Line D depicts that RF9_3 line 356 activates local sense amplifier cell 22 and sense amplifier cell 12. Line T corresponds to RSAE3 line 358 to show a continual input for both sense amplifier cells and local sense amplifier cells as a clock signal for the SHR gates of each of the circuits.

FIG. 10A provides a logic illustration of local address decode circuit 64 for activating sense amplifier cell 16 which is the edge sense amplifier cell. As FIG. 10A depicts, line A, which corresponds to RF9_0 line 350, provides input to inverter 370, while line B, which corresponds to RF9_1 line 352 and T-input, corresponding to RSAE3 line 358, go to NAND gate 372. The output of inverter 370 and NAND gate 372 go to NAND gate 374, the output of which provides an enable signal for sense amplifier cell 16. When the output of NAND gate 374 is high, sense amplifier cell 16 is activated.

FIG. 10B provides a logical conceptional diagram of local address decode circuit 62 of FIG. 1. Circuit 62 includes NOR gate 376 which has its output coupled to an input of NAND gate 378. OR gate 380 has an output which is coupled to an input of NAND gate 382, the output of which is coupled to an input of NAND gate 378. Thus, the logical B input with C input, corresponding to RF9_2 line 354, goes to NOR gate 376. The A input and D input, corresponding to RF9_3 line 356, go to OR gate 380, the output of which is combined with the T input corresponding to RSAE3 in NAND gate 382. When the output from either NOR gate 376 or NAND gate 382 is low, the output of NAND gate 378 goes high to provide an enable signal to sense amplifier cells 14 and 16. This will occur when either B or C is high, or when T is high and either A or D is high. The output signal 154 is supplied to the array control circuits 56, 52.

FIG. 10c illustrates how the logic circuitry of FIGS. 10A and B, coupled with the inputs that FIG. 9 describes, operate to activate sense amplifier cells 16, 14, and 12, together with local sense amplifiers 20 and 22. To read a row, between sense amplifier cell 16 and local sense amplifier cell 20, such as cell 340, it is necessary to activate RF9 0 line 350 and Enable_T line 360 to activate local sense amplifier cell 20. This also requires, however, the subsequent activation of sense amplifier cell 14 and 16 by asserting the RSAE3 358 signals. Thus, RF9_0 line 350 provides input not only to sense amplifier cell 16 and local sense amplifier cell 20, but also to sense amplifier cell 14. This provides the necessary sequence for activating the sense amp/local sense amplifier architecture of the present invention. Then, after turning on sense amplifier 14 and 16, it is possible to activate the Y-select to retrieve the data from the sense amp in the associated memory cell array. Thus, if RF9_0 line 350 is high, this makes it possible to access a bit between local sense amplifier cell 20 and sense amplifier cell 16.

When RF9_1 line 352 goes high and the Enable_T line 360 is asserted, this activates local sense amplifier cell 20 and sense amplifier cells 14 and 16. Further, if RF9_2 line 354 goes high, it goes to sense amplifier cells 12 and 14 and local sense amplifier cell 22. Similarly, if RF9 3 line 356 goes high, this provides input to sense amplifier cells 12 and 14 and local sense amplifier cell 22. This completes the logic associated the sense amplifier activation. In conjunction with the sense amplifier activation logic of the present invention, however, there is local sense amplifier activation that is a function of the RF9 signals and the Enable_T signal.

FIG. 11 provides a table for illustrating the activation of local sense amplifier cell 20, for example. Referring to FIG. 8 and FIG. 11, an understanding of the process for local sense amplifier activation can be acquired. Suppose that word line 402 is high, then cell 340 on bitline BL0 260 and cell 342 on bitline BL1end 268 will be accessed. When this occurs, reading bit 342 is to occur first by activating local sense amplifier cell 20. This requires turning off SHR1 256, SHR3 250, SHR4 248 to isolate the local sense amp from the surrounding bitlines. Initially, SHR2 line 258 will be on, as well as SHR3 line 250 and SHR4 line 248. This means that when the sense operation occurs, BL0 bitline 260 will be isolated from BL0end bitline 232, while BL0 line 264 will be isolated from BL0end_ line 236. At this point, local sense amplifier cell 20 is turned on. Since SHR2 line 258 is on, this makes it possible to resolve bit 342 on BL1end line 268 in the local sense amplifier 20.

The next step is to direct data from local sense amplifier cell 20 through BL1 line 240 and BL1_ 244 to sense amplifier cell 16. Once data from bit 342 goes to sense amplifier cell 16 by turning on SHR4 248 and activating sense amp 16, it is possible to energize the Y-select circuitry of sense amplifier cell 16 as part of a normal read operation.

Control of SHR1 line 256, SHR2 line 258, SHR3 line 250, and SHR4 line 248 depends on which side of the local sense amplifier the storage or array cell is being accessed. When using the sense amplifier cell 14 with local sense amplifier cell 20 (to access a cell in array 26), operation will be as previously described. On the other hand, when using the sense amplifier cell 16 without local sense amplifier cell 20 to access a cell in array 28, the accessing steps will be different. What will be the same, however, is the two-step procedure of first reading the bit connected to the bitline segments that do not connect to a sense amp by activating the local sense amplifier 20, directing the bit information to the local sense amplifier 20, and then reading the bit information from the local sense amplifier cell 20 to the sense amplifier cell 16 while activating sense amplifier 14 at the same time. Once a sense amplifier receives data from the bitline, the data may be sent to I/O lines 318, 320 and 388, 390, and operation of the memory cell circuit 10 will be similar to that of conventional memory array circuits. Thus, because local sense amplifier cell 20 does not include Y-select circuitry or I/O circuitry, it may be made smaller. The trade-off for this space savings is the need for timing circuits and control circuits to send the data that local sense amplifier circuit 20 receives from the bitline to the normal sense amplifier cell 14 that includes the necessary Y-select and I/O circuitry.

FIG. 11 shows the truth table of the circuitry 104 of FIG. 2, to illustrate the process of local sense amplifier 20 activation when accessing memory cells in array 26. The upper half of FIG. 11 represents the condition when the Enable_T signal line 360 is low. This corresponds to the situation of SHR2 line 258 is on, while SHR1 line 256, SHR3 line 250, and SHR4 line 248 are off. In the bottom half, the Enable_T signal on RSAE3 line 358 is on, which corresponds to both SHR1 line 404 and SHR4 line 408 turning on. Note that in the table of FIG. 11, the entries are the SHRB values, which are inverted to generate the SHR line values. Thus, to access bit 340, the value of RF9_0 line 350 is high. This corresponds to the value for RF9_0 equaling "1" at reference number 410 and the "0" values for SHRB2. In the next step, the Enable_T value goes high. While SHR2 line 404 remains high, SHR4 line 408 also goes high. This corresponds to the "0" values for SHRB2 entry 412 and SHRB4 value 414. Other values appearing in FIG. 11 for RF9_0 line 350 and RF9_1 line 352 relate to accessing other bits, for example, between sense amplifier cell 16 and sense amplifier cell 20 of FIG. 8.

Figure 12:
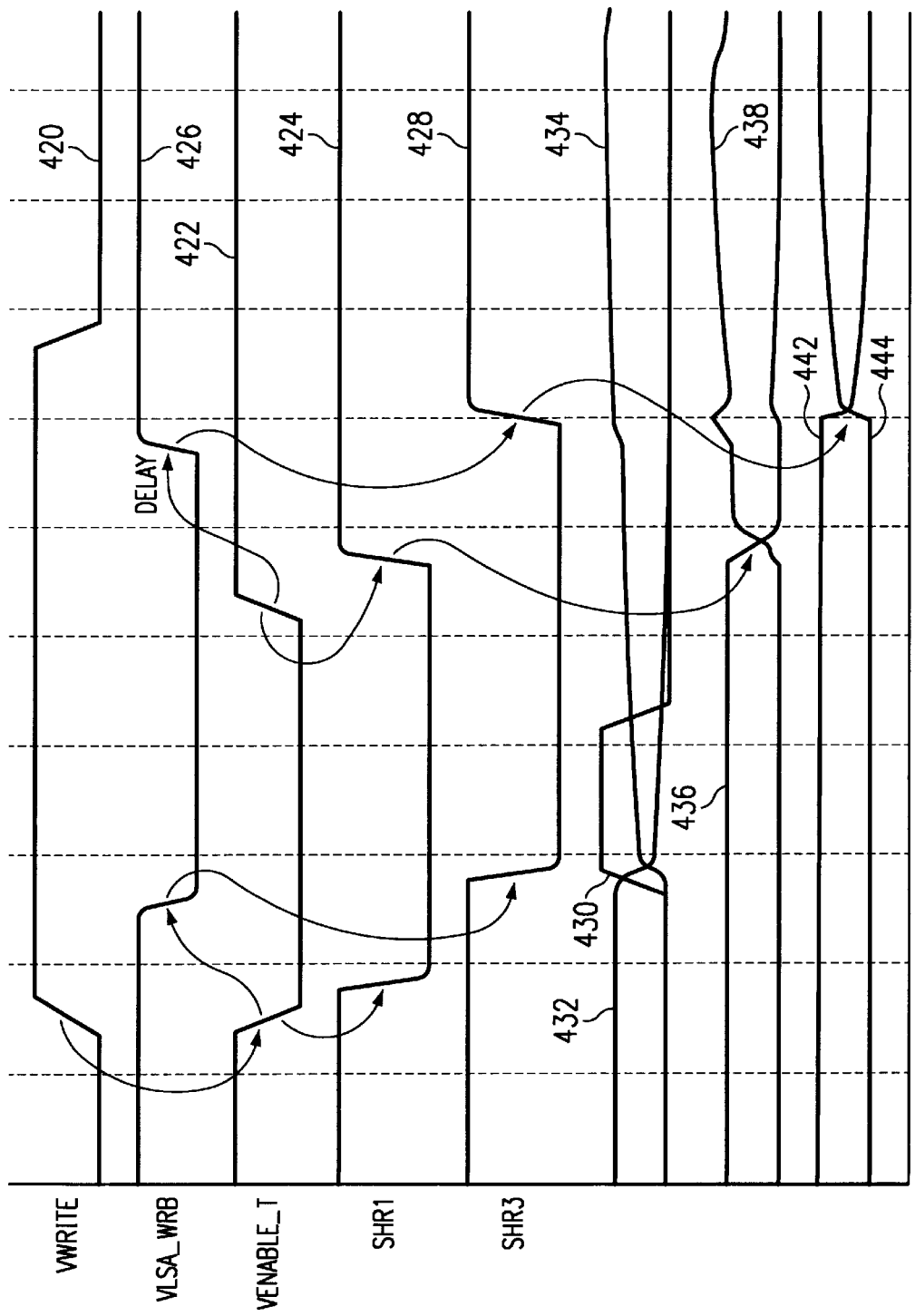
FIG. 12 is a timing diagram showing part of a write operation in the circuit of FIG. 1.

FIG. 12 illustrates the write operation of the sense amp/local sense amplifier architecture of the present invention. FIG. 12 includes a timing diagram that includes write signal 420 which initiates the write operation. In the write operation, data from an I/O line goes to a cell in memory array 28 or 30 (FIG. 1), for example. Referring to FIG. 1 and FIG. 12, on line 82, a write signal may be received from external circuitry. Line 420 depicts the level appearing on line 82, at which point a write causes the Enable_T to go low after some pre-programmed delay. The cell 512 in memory array 28 is being access in this example, with a read operation already completed to restore the cell level at bitline 232. Once the Enable_T value goes low, SHR1 line 256 goes low, as line 424 indicates. This turns off SHR gate 1 within the local sense amp. Also, when the Enable_T value goes low, the local sense amp write value, as line 426 indicates, goes low after some delay programmed by circuit 440 in FIG. 1. The LSA write value of line 426 going low causes the SHR3 value, as line 428 shows, to go low. Next, in response to SHR3 line 406 going low, the Y-select line 326 (FIG. 7) goes high as line 430 indicates, to activate the Y-select circuitry of sense amplifier circuit 14, for example. With Y-select circuitry being activated and complementary data appearing on the I/O lines 332 and 334, bitlines such as BL0 line 260 and BL0_ line 264 may switch value. That is, FIG. 12 shows that line 432 goes low while line 434 goes high, showing a write operation to write a complementary data state into the memory cell.

To write to a bit, for example a bit on BL0end line 232 of FIG. 8 (the bitline segment not connected to a sense amplifier but instead only connected to a local sense amplifier), the Enable_T value goes high as line 422 indicates. Enable_T going high causes SHR1 line 424 to go high. Since BL0 line 260 is connected to local sense amplifier 20, the state of BL0 line 260 is reflected at local sense amplifier cell 20, as shown by the inversion of line 436 and 438. After a predetermined delay, caused by the delay circuit 440 of FIG. 1, local sense amp write value 426 goes high, causing SHR3 line 250 to go high, as line 428 indicates. The delay is necessary to ensure that the BL0 260 and BL0_ 264 can overwrite the previous state of local sense amp 20. SHR3 line 250 going high causes an inversion in the bitline ends on the local sense amplifiers, as shown by the inversion value of lines 442 and 444. Therefore, whatever information is in the local sense amplifier at this point in time goes to BL0end line 232 and BL0end_ line 236. This results in data being written to memory array 28, at which point the write signal goes low again, as line 420 indicates.

Operation of the present invention for writing to a memory cell, therefore, differs from that of writing to a cell using a normal sense amplifier in that, like the read operation, is a two-step process. In a normal sense amplifier write operation, the write signal is asserted, data is transmitted on the bitline, and the data simply goes directly to the memory cell. With the present invention, however, once the write signal is asserted, such as the write signal on line 82 going high, writing to the short segment of BL0 line 260 and BL0_ 264, or BL1 240 and BL1_ 244, first occurs when writing to memory array 28, for example. Then, data is written to local sense amplifier 20. Then, the last SHR gate for writing to BL0end line 232 is activated. This changes the state of the bitline end and permits writing to the designated memory cell. Thus, with the present invention, a somewhat more complex process results, but with reduced bitline capacitance, and with reduced area and power consumption.

A technical advantage that the present invention provides is a local sense amplifier scheme that reduces the area of the sense amplifier circuit, in particular by employing smaller local sense amplifiers together with traditional sense amplifiers. The small local sense amplifiers contain more share gates, but do not contain bitline equalization-precharge and Y-select circuits, which would consume more circuit layout area than the additional share gates. Other technical advantages that the present invention provides include a reduced layout area, minimal effect on speed, and reduced power consumption.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. An apparatus, comprising:

first and second sense amplifier circuits;

a first bitline having two ends which are respectively coupled to said first and second sense amplifier circuits;

a second bitline having an end coupled to said second sense amplifier circuit; and a first memory cell operatively coupled to said first bitline; and a second memory cell operatively coupled to said second bitline;

said first sense amplifier circuit being operative to communicate with said first memory cell through said first bitline; and said first and second sense amplifier circuits being operative to cooperatively facilitate communication between said first sense amplifier circuit and said second memory cell through said first bitline, said second sense amplifier circuit, and said second bitline.

2. An apparatus according to claim 1, wherein said first sense amplifier circuit includes a sense amplifier, an equalization circuit, and a data transfer circuit; and wherein said second sense amplifier circuit includes a sense amplifier, and is free of an equalization circuit and a data transfer circuit.

3. An apparatus according to claim 1, wherein said first sense amplifier circuit includes a selectively actuatable share gate for selectively permitting and preventing electrical communication between said first sense amplifier circuit and said first bitline.

4. An apparatus according to claim 1, wherein said second sense amplifier circuit includes a selectively actuatable first share gate which is operative to selectively permit and prevent electrical communication between said second sense amplifier circuit and said first bitline; and wherein said second sense amplifier circuit includes a selectively actuatable second share gate which is operative to selectively permit and prevent electrical communication between said second sense amplifier circuit and said second bitline.

5. An apparatus according to claim 1, including:

a third sense amplifier circuit;

a third bitline having ends respectively coupled to said second and third sense amplifier circuits;

a fourth bitline having one end coupled to said second sense amplifier circuit;

four selectively actuatable share gates which each selectively permit and prevent electrical communication between said second sense amplifier circuit and a respective one of said first, second, third and fourth bitlines;

a third memory cell operatively coupled to said third bitline between said second and third sense amplifier circuits; and a fourth memory cell operatively coupled to said fourth bitline;

said third sense amplifier circuit being operative to communicate with said third memory cell through said third bitline, and said third and second sense amplifier circuits being operative to cooperatively facilitate communication between said third sense amplifier circuit and said fourth memory cell through said third bitline, said second sense amplifier circuit, and said fourth bitline.

6. An apparatus according to claim 1, wherein said first sense amplifier circuit includes a sense amplifier, an equalization circuit, and a data transfer circuit; and wherein said second sense amplifier circuit includes a sense amplifier.

7. An apparatus according to claim 6, wherein said first sense amplifier circuit includes a selectively actuatable share gate for selectively permitting and preventing electrical communication between said first sense amplifier circuit and said first bitline; and wherein said first and second sense amplifier circuits are operative to read data from said second memory cell by operating said equalization circuit with said share gate enabled, thereafter disabling said equalization circuit and said share gate, thereafter operating said sense amplifier in said second sense amplifier circuit, thereafter actuating said share gate, thereafter operating said sense amplifier in said first sense amplifier circuit, and thereafter enabling said data transfer circuit.

8. An apparatus according to claim 6, wherein said first sense amplifier circuit includes a selectively actuatable share gate for selectively permitting and preventing electrical communication between said first sense amplifier circuit and said first bitline; and wherein said first and second sense amplifier circuits are operative to write data to said second memory cell by operating said equalization circuit with said share gate enabled, thereafter disabling said equalization circuit and said share gate, thereafter operating said sense amplifier in said second sense amplifier circuit, thereafter actuating said share gate, thereafter operating said sense amplifier in said first sense amplifier circuit, thereafter disabling said share gate, thereafter enabling said data transfer circuit, and thereafter enabling said share gate.

9. An apparatus according to claim 1, including a third bitline extending between said first and second sense amplifier circuits, and a fourth bitline having one end coupled to said second sense amplifier circuit;

wherein said second sense amplifier circuit includes fifth and sixth bitlines, a sense amplifier coupled between said fifth and sixth bitlines, first and second share gates for selectively electrically coupling said fifth and sixth bitlines respectively to said second and fourth bitlines, and third and fourth share gates for selectively electrically coupling said fifth and sixth bitlines respectively to said first and third bitlines; and wherein said first sense amplifier circuit includes seventh and eighth bitlines, a sense amplifier coupled between said seventh and eighth bitlines, and fifth and sixth share gates for selectively electrically coupling said seventh and eighth bitlines respectively to said first and third bitlines.

10. An apparatus according to claim 9, wherein said first sense amplifier circuit includes an equalization circuit coupled between said seventh and eighth bitlines, and includes a data transfer circuit coupled between said seventh and eighth bitlines.

11. A method for operating a memory which includes first and second sense amplifier circuits coupled to each other by a first bitline, a second bitline coupled to the second sense amplifier circuit, and first and second memory cells respectively coupled to the first and second bitlines, comprising the steps of:

causing the first sense amplifier circuit to communicate with the first memory cell through the first bitline; and causing the first and second sense amplifier circuits to cooperatively facilitate communication between the first sense amplifier circuit and the second memory cell through the first bitline, the second sense amplifier circuit, and the second bitline.

12. A method according to claim 11, wherein the first sense amplifier circuit includes a selectively actuatable share gate for selectively permitting and preventing electrical communication between the first sense amplifier circuit and the first bitline; and wherein said step of causing the first and second sense amplifier circuits to cooperatively facilitate communication includes the step of causing the first and second sense amplifier circuits to read data from the second memory cell by carrying out the steps of:

operating an equalization circuit in the first sense amplifier circuit with the share gate enabled;

thereafter disabling the equalization circuit and the share gate;

thereafter operating a sense amplifier in the second sense amplifier circuit;

thereafter actuating the share gate;

thereafter operating a sense amplifier in the first sense amplifier circuit; and thereafter enabling a data transfer circuit in the first sense amplifier circuit.

13. A method according to claim 11, including first and second wordlines respectively associated with the first and second memory cells; wherein the first sense amplifier circuit includes a first selectively actuatable share gate for selectively permitting and preventing electrical communication between the first sense amplifier circuit and the first bitline; wherein the second sense amplifier circuit includes a second selectively actuatable share gate for selectively permitting and preventing electrical communication between the second sense amplifier circuit and the first bitline; and wherein said step of causing the first and second sense amplifier circuits to cooperatively facilitate communication includes the step of causing the first and second sense amplifier circuits to read data from the second memory cell by carrying out the steps of:

operating an equalization circuit in the first sense amplifier circuit with the first and second share gates enabled;

thereafter disabling the equalization circuit and the first and second share gates;

thereafter activating the second wordline to select the second memory cell;

thereafter operating a sense amplifier in the second sense amplifier circuit;

thereafter actuating the first and second share gates;

thereafter operating a sense amplifier in the first sense amplifier circuit; and thereafter enabling a data transfer circuit in the first sense amplifier circuit.

14. A method according to claim 11, wherein the first sense amplifier circuit includes a selectively actuatable share gate for selectively permitting and preventing electrical communication between the first sense amplifier circuit and the first bitline; and wherein said step of causing the first and second sense amplifier circuits to cooperatively facilitate communication includes the step of causing the first and second sense amplifier circuits to write data to the second memory cell by carrying out the steps of:

operating an equalization circuit in the first sense amplifier circuit with the share gate enabled;

thereafter disabling the equalization circuit and the share gate;

thereafter operating a sense amplifier in the second sense amplifier circuit;

thereafter actuating the share gate;

thereafter operating a sense amplifier in the first sense amplifier circuit;

thereafter disabling the share gate;

thereafter enabling a data transfer circuit in the first sense amplifier circuit; and thereafter enabling the share gate.

15. A method according to claim 11, including first and second wordlines which are respectively associated with the first and second memory cells; wherein the first sense amplifier circuit includes a selectively actuatable first share gate for selectively permitting and preventing electrical communication between the first sense amplifier circuit and the first bitline; wherein the second sense amplifier circuit includes a selectively actuatable second share gate for selectively permitting and preventing electrical communication between the second sense amplifier circuit and the first bitline; and wherein said step of causing the first and second sense amplifier circuits to cooperatively facilitate communication includes the step of causing the first and second sense amplifier circuits to write data to the second memory cell by carrying out the steps of:

operating an equalization circuit in the first sense amplifier circuit with the first and second share gates enabled;

thereafter disabling the equalization circuit and the first and second share gates;

thereafter activating the second wordline to select the second memory cell;

thereafter operating a sense amplifier in the second sense amplifier circuit;

thereafter enabling the first and second share gates;

thereafter operating a sense amplifier in the first sense amplifier circuit;

thereafter disabling the second share gate;

thereafter enabling a data transfer circuit in the first sense amplifier circuit; and thereafter enabling the second share gate.

16. A method according to claim 11, including a third sense amplifier circuit, a third bitline having ends respectively coupled to the second and third sense amplifier circuits, a fourth bitline having one end coupled to the second sense amplifier circuit, a third memory cell operatively coupled to the third bitline between the second and third sense amplifier circuits, and a fourth memory cell operatively coupled to the fourth bitline; and including the steps of:

causing the third sense amplifier circuit to communicate with the third memory cell through the third bitline; and causing the third and second sense amplifier circuits to cooperatively facilitate communication between the third sense amplifier circuit and the fourth memory cell through the third bitline, the second sense amplifier circuit, and the fourth bitline.

* * * * *